US012513972B2

(12) United States Patent
Kim et al.

(10) Patent No.: US 12,513,972 B2
(45) Date of Patent: Dec. 30, 2025

(54) SEMICONDUCTOR DEVICE AND METHOD OF FABRICATING THE SAME

(71) Applicant: Samsung Electronics Co., Ltd., Suwon-si (KR)

(72) Inventors: Jae-Jung Kim, Suwon-si (KR); Chanhyeong Lee, Suwon-si (KR); Jinkyu Jang, Suwon-si (KR); Rakhwan Kim, Suwon-si (KR); Dongsoo Lee, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 333 days.

(21) Appl. No.: 16/707,118

(22) Filed: Dec. 9, 2019

(65) Prior Publication Data

US 2020/0381311 A1    Dec. 3, 2020

(30) Foreign Application Priority Data

May 29, 2019    (KR) ........................ 10-2019-0063033

(51) Int. Cl.
*H10D 84/03*    (2025.01)
*H01L 21/02*    (2006.01)
(Continued)

(52) U.S. Cl.
CPC ..... *H10D 84/038* (2025.01); *H01L 21/02532* (2013.01); *H01L 21/02603* (2013.01);
(Continued)

(58) Field of Classification Search
CPC ............ H01L 21/28114; H01L 29/775; H01L 29/66439; H01L 29/66772; H01L 21/32139; B82Y 10/00
See application file for complete search history.

(56) References Cited

U.S. PATENT DOCUMENTS 9,252,252 B2    2/2016    De Micheli et al.
9,748,352 B2    8/2017    Liu et al.
(Continued)

FOREIGN PATENT DOCUMENTS

CN    109119420 A    1/2019
CN    109473473 A    3/2019
(Continued)

OTHER PUBLICATIONS

Lima et al. ("Metal gate work function tuning by Al incorporation in TiN", J. Appl. Phys. 115, 074504 (2014)) (Year: 2014).*

*Primary Examiner* — Brian Turner
(74) *Attorney, Agent, or Firm* — HARNESS, DICKEY & PIERCE, P.L.C.

(57) ABSTRACT

A semiconductor device may include a channel pattern stacked on a substrate and a gate electrode on the substrate. The channel pattern includes semiconductor patterns. The gate electrode extends to cross the channel pattern. The gate electrode may include dielectric layers, first work function adjusting patterns, and second work function adjusting patterns. The dielectric layers may enclose the semiconductor patterns, respectively. The first work function adjusting patterns may enclose the dielectric layers, respectively, and the second work function adjusting patterns may enclose the first work function adjusting patterns, respectively. The first work function adjusting patterns may be formed of an aluminum-containing material, and each corresponding one of the first work function adjusting patterns may be in contact with a corresponding one of the second work function adjusting patterns enclosing the corresponding one of the first work function adjusting patterns.

15 Claims, 32 Drawing Sheets

(51) Int. Cl.
  *H01L 21/28*  (2025.01)
  *H10B 10/00*  (2023.01)
  *H10D 30/01*  (2025.01)
  *H10D 30/67*  (2025.01)
  *H10D 62/10*  (2025.01)
  *H10D 64/01*  (2025.01)
  *H10D 64/66*  (2025.01)
  *H10D 84/01*  (2025.01)
  *H10D 84/85*  (2025.01)

(52) U.S. Cl.
  CPC ..... *H01L 21/28088* (2013.01); *H10B 10/125* (2023.02); *H10B 10/18* (2023.02); *H10D 30/031* (2025.01); *H10D 30/6735* (2025.01); *H10D 30/6739* (2025.01); *H10D 30/6757* (2025.01); *H10D 62/121* (2025.01); *H10D 64/017* (2025.01); *H10D 64/667* (2025.01); *H10D 84/0167* (2025.01); *H10D 84/0177* (2025.01); *H10D 84/85* (2025.01)

(56) References Cited

U.S. PATENT DOCUMENTS

| | | | |
|---|---|---|---|
| 9,799,745 | B2 | 10/2017 | Lee et al. |
| 10,008,583 | B1 | 6/2018 | Rodder et al. |
| 10,049,940 | B1 | 8/2018 | Chen et al. |
| 10,340,358 | B2 | 7/2019 | Suh et al. |
| 10,461,167 | B2 | 10/2019 | Lee et al. |
| 10,475,898 | B2 | 11/2019 | Chung et al. |
| 10,700,064 | B1* | 6/2020 | Zhang ............... H01L 29/78 |
| 11,411,124 | B2 | 8/2022 | Kim et al. |
| 2010/0327364 | A1* | 12/2010 | Tsuchiya ......... H01L 21/28079 257/E21.409 |
| 2012/0228715 | A1* | 9/2012 | Niimi ............ H01L 21/823864 257/369 |
| 2014/0051213 | A1* | 2/2014 | Chang .................. B82Y 10/00 438/151 |
| 2015/0132953 | A1* | 5/2015 | Nowling ......... H01L 21/67086 438/692 |
| 2015/0262828 | A1 | 9/2015 | Brand et al. |
| 2016/0204195 | A1* | 7/2016 | Wen ..................... H10D 30/014 438/157 |
| 2017/0084711 | A1* | 3/2017 | Lim .................. H01L 21/82345 |
| 2017/0125298 | A1* | 5/2017 | Jangjian ........... H01L 21/28088 |
| 2017/0170331 | A1* | 6/2017 | Liang ................. H01L 29/7848 |
| 2017/0365604 | A1* | 12/2017 | Suh ....................... H01L 27/092 |
| 2018/0019242 | A1* | 1/2018 | Liao ..................... H01L 29/517 |
| 2018/0151564 | A1 | 5/2018 | Lee et al. |
| 2018/0226484 | A1* | 8/2018 | Bao ......................... B82Y 10/00 |
| 2018/0261460 | A1 | 9/2018 | Hwang et al. |
| 2018/0374926 | A1 | 12/2018 | Lee et al. |
| 2019/0081152 | A1* | 3/2019 | Suh ..................... H10D 62/121 |
| 2019/0140066 | A1* | 5/2019 | Lee .................. H01L 21/28088 |
| 2019/0172828 | A1* | 6/2019 | Smith ............... H01L 29/42392 |
| 2019/0304848 | A1* | 10/2019 | Cheng ............... H01L 21/32134 |
| 2019/0348530 | A1* | 11/2019 | Ando .................... H01L 29/775 |
| 2019/0355719 | A1* | 11/2019 | Maeda ................ H01L 29/0607 |
| 2019/0371675 | A1* | 12/2019 | Tsai .................... H01L 29/4966 |
| 2020/0176581 | A1* | 6/2020 | Lee .................. H01L 21/82345 |
| 2020/0273710 | A1* | 8/2020 | Zhang ................ H01L 29/4966 |
| 2020/0294865 | A1* | 9/2020 | Cheng ............... H01L 21/0337 |
| 2020/0365584 | A1* | 11/2020 | Ando .................... H01L 29/775 |

FOREIGN PATENT DOCUMENTS

| | | |
|---|---|---|
| CN | 109473479 A | 3/2019 |
| KR | 20180104476 A | 9/2018 |
| KR | 20180123422 A | 11/2018 |
| KR | 20190000965 A | 1/2019 |
| KR | 101954412 B1 | 3/2019 |
| KR | 20190028061 A | 3/2019 |
| KR | 20190028606 A | 3/2019 |
| KR | 20190031855 A | 3/2019 |

\* cited by examiner

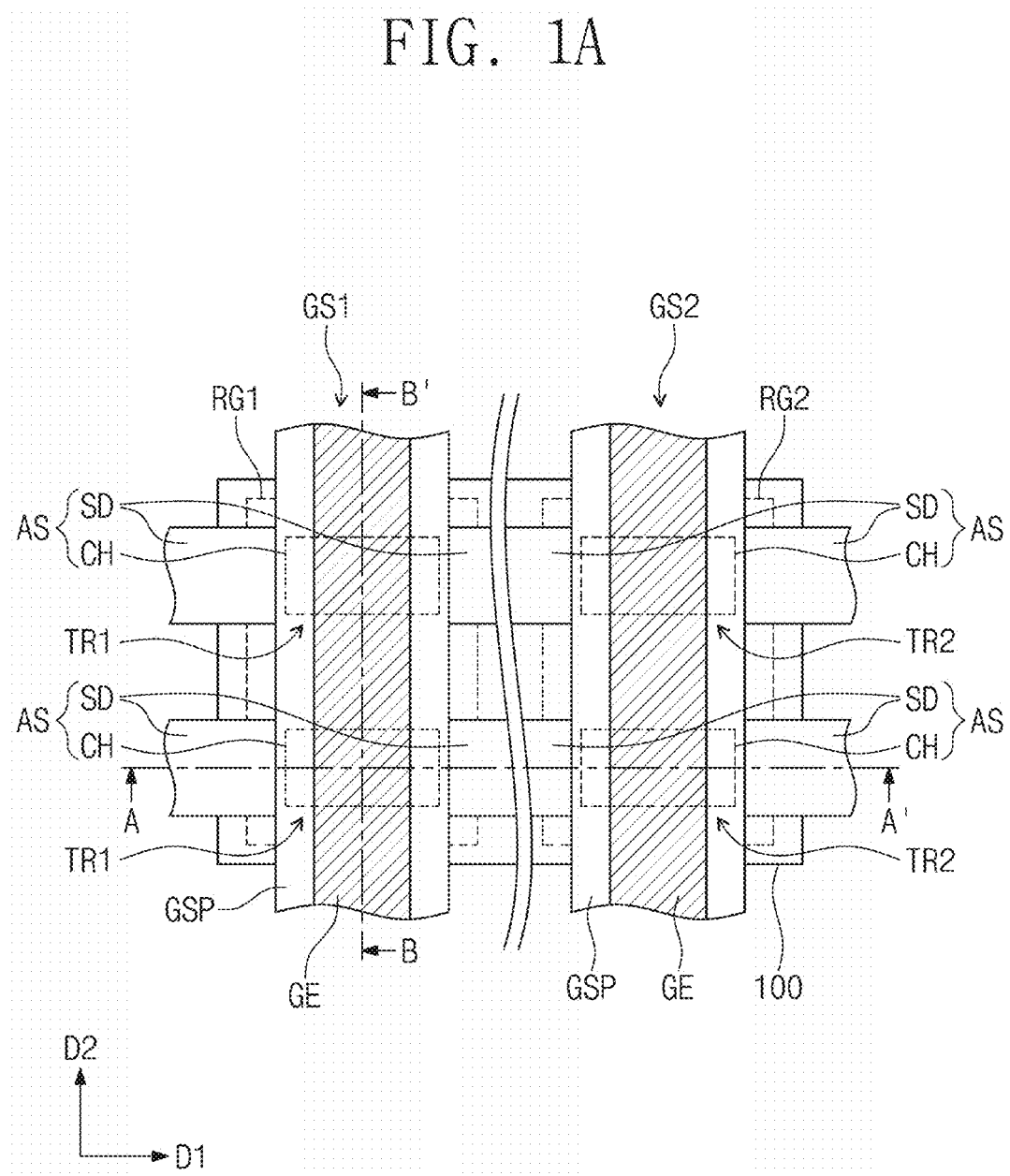

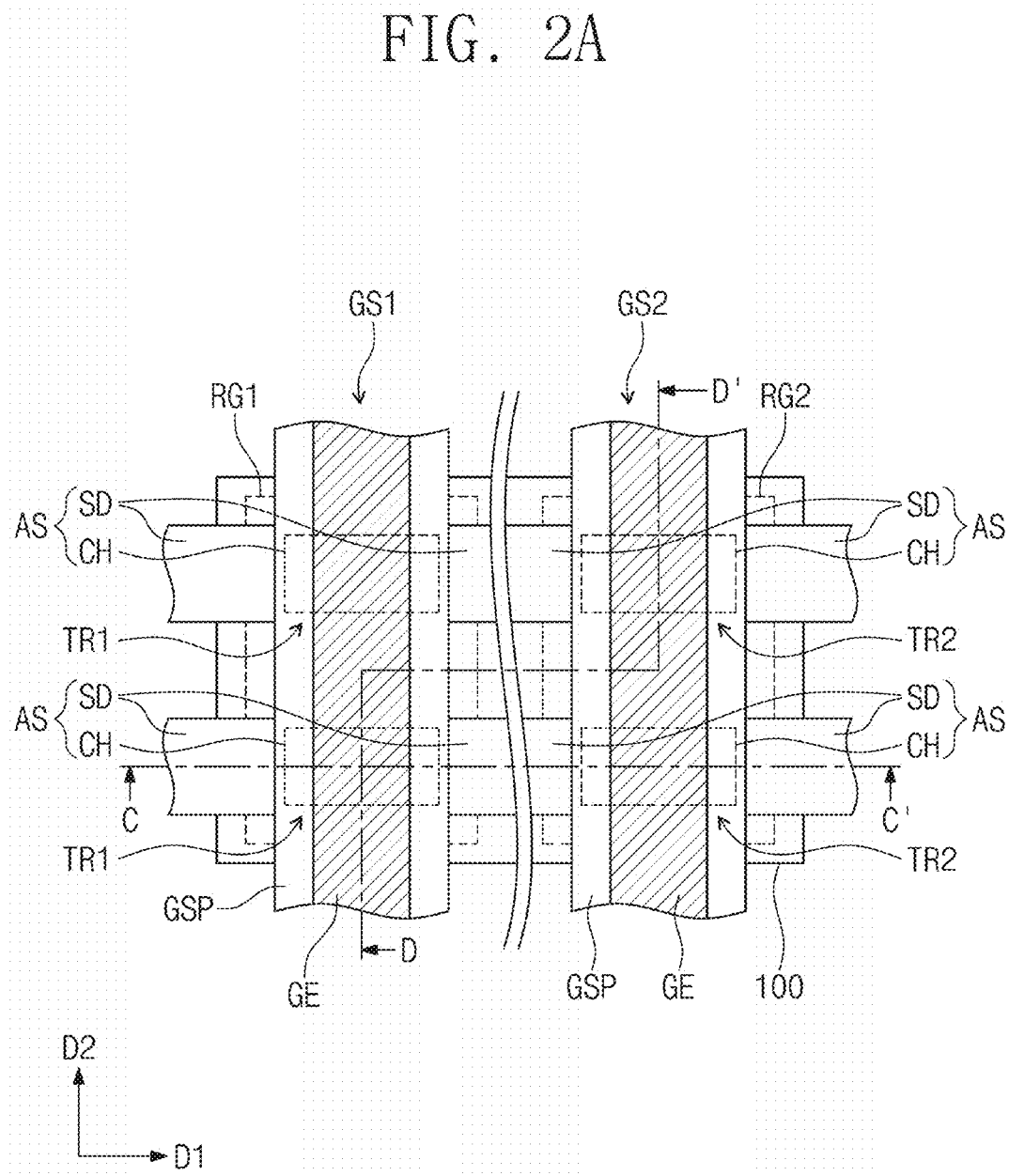

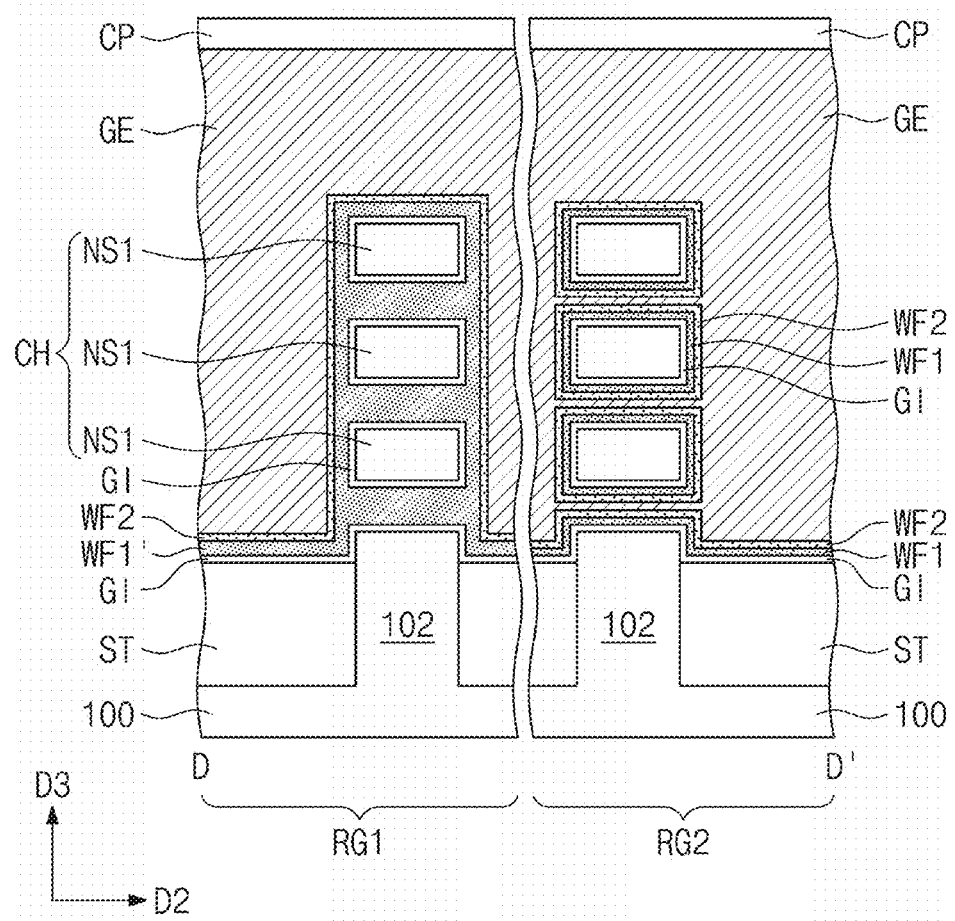

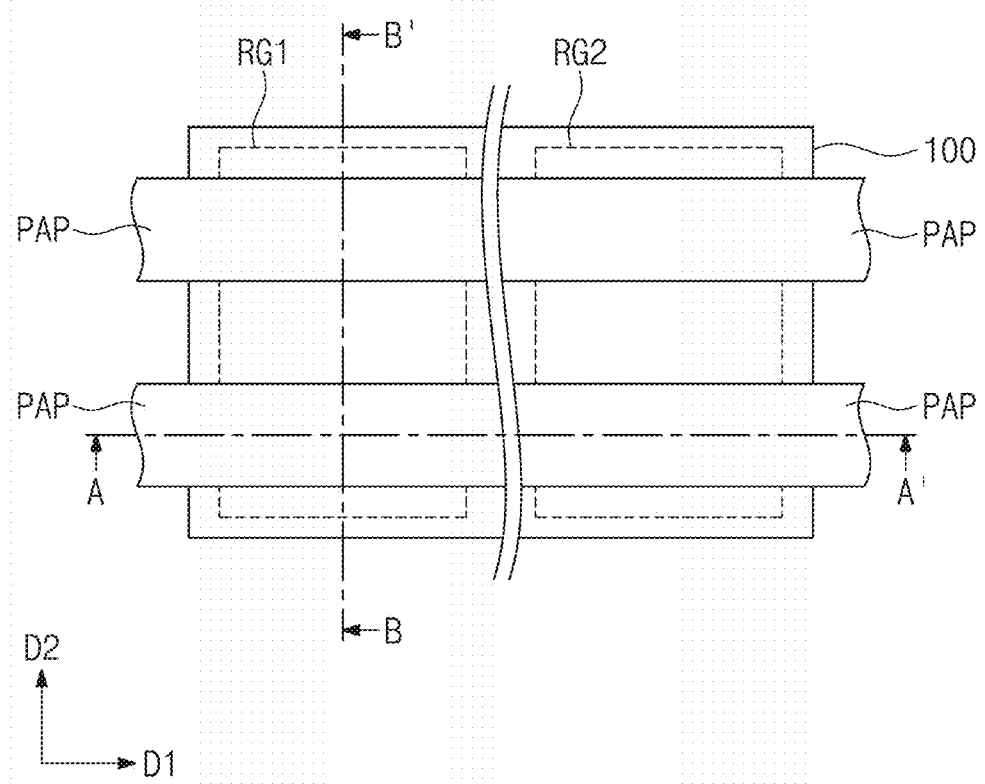

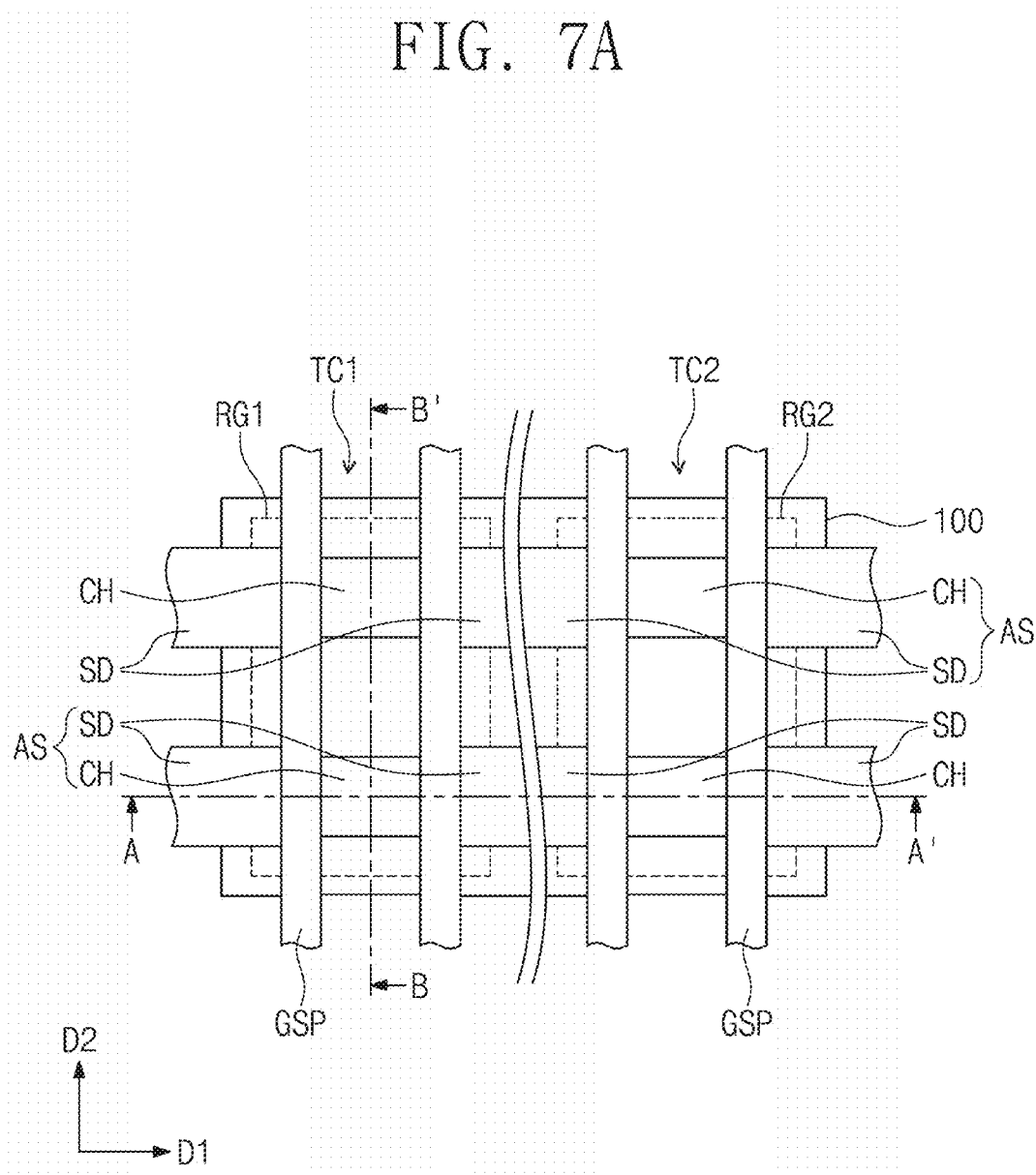

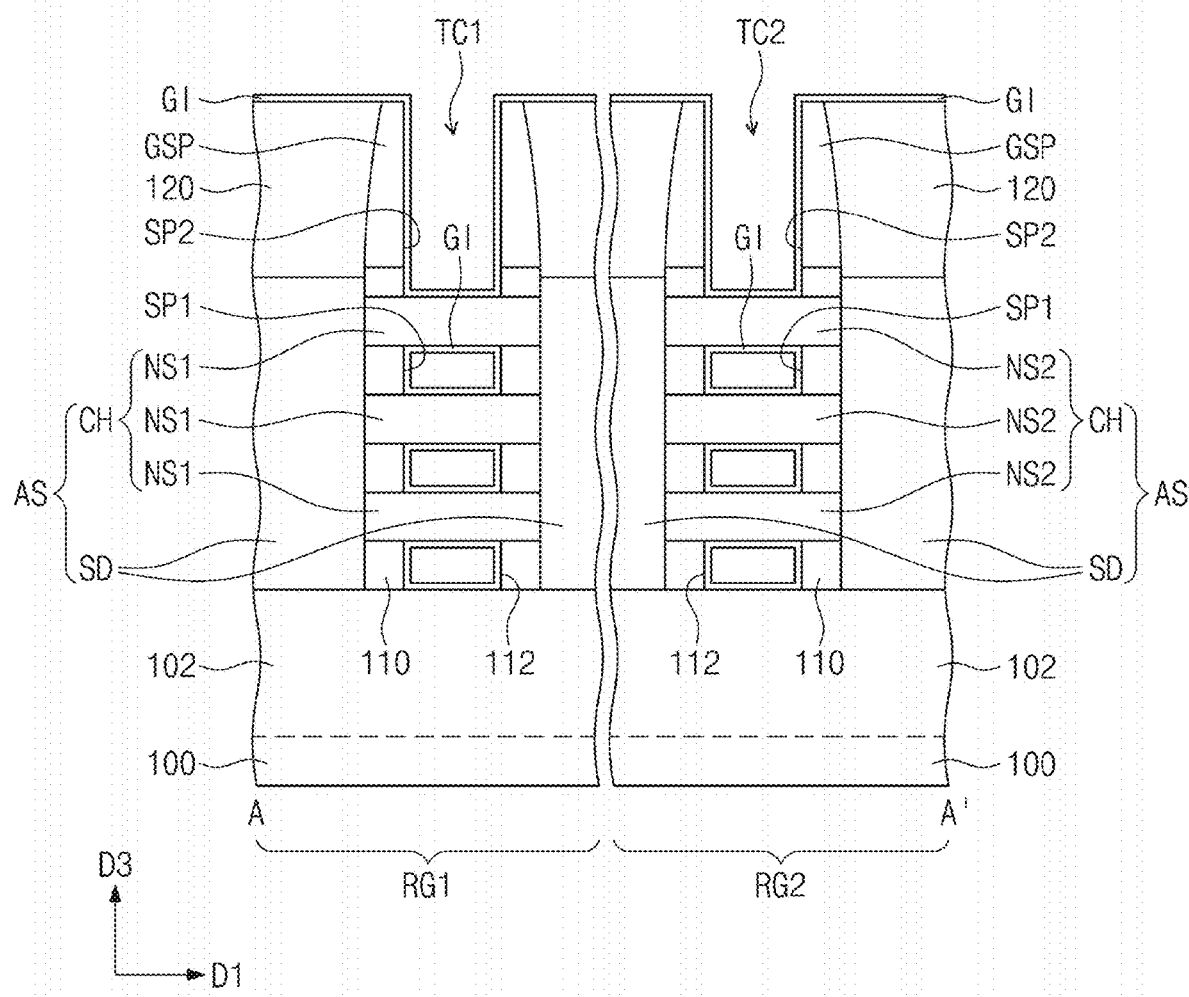

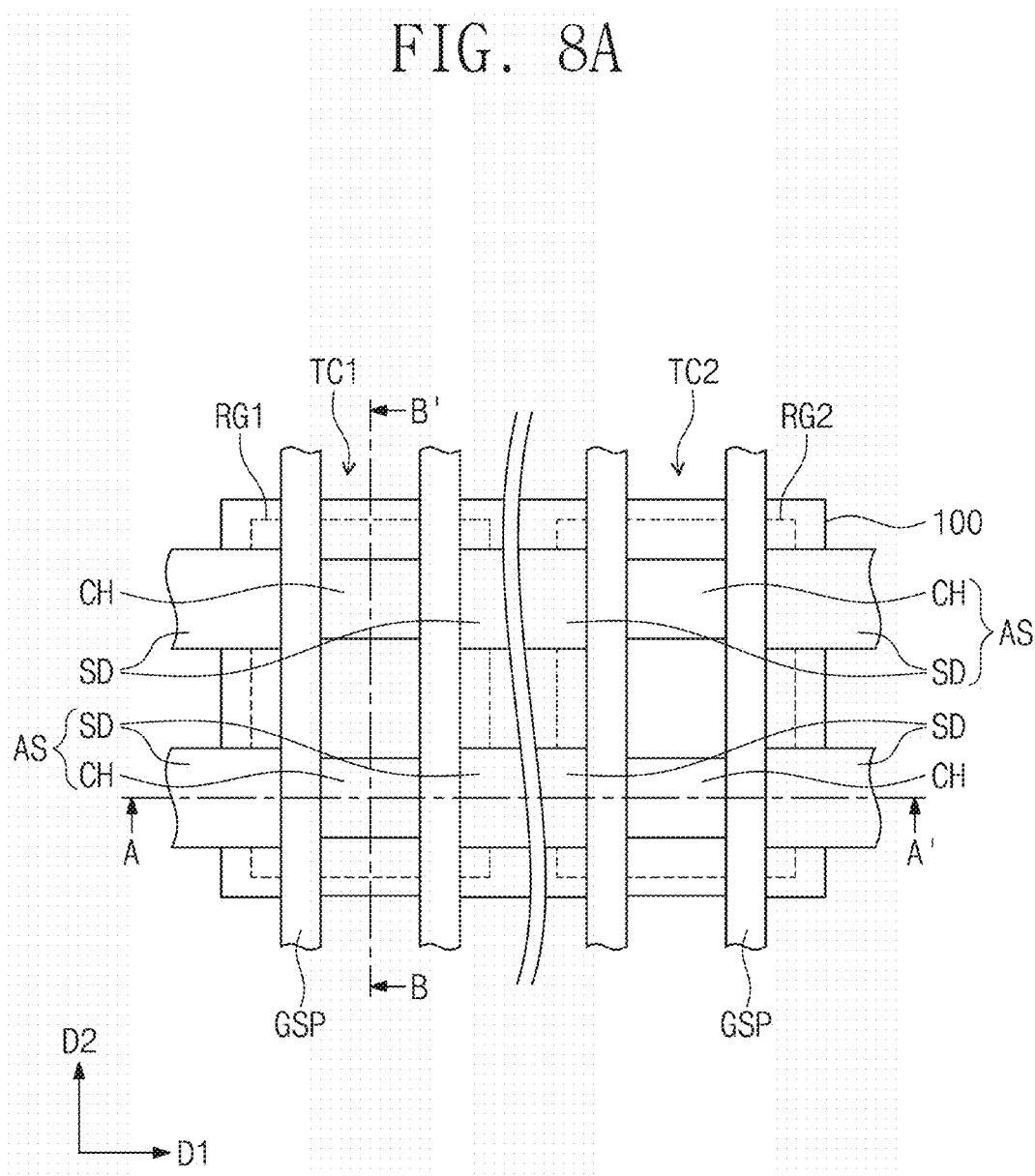

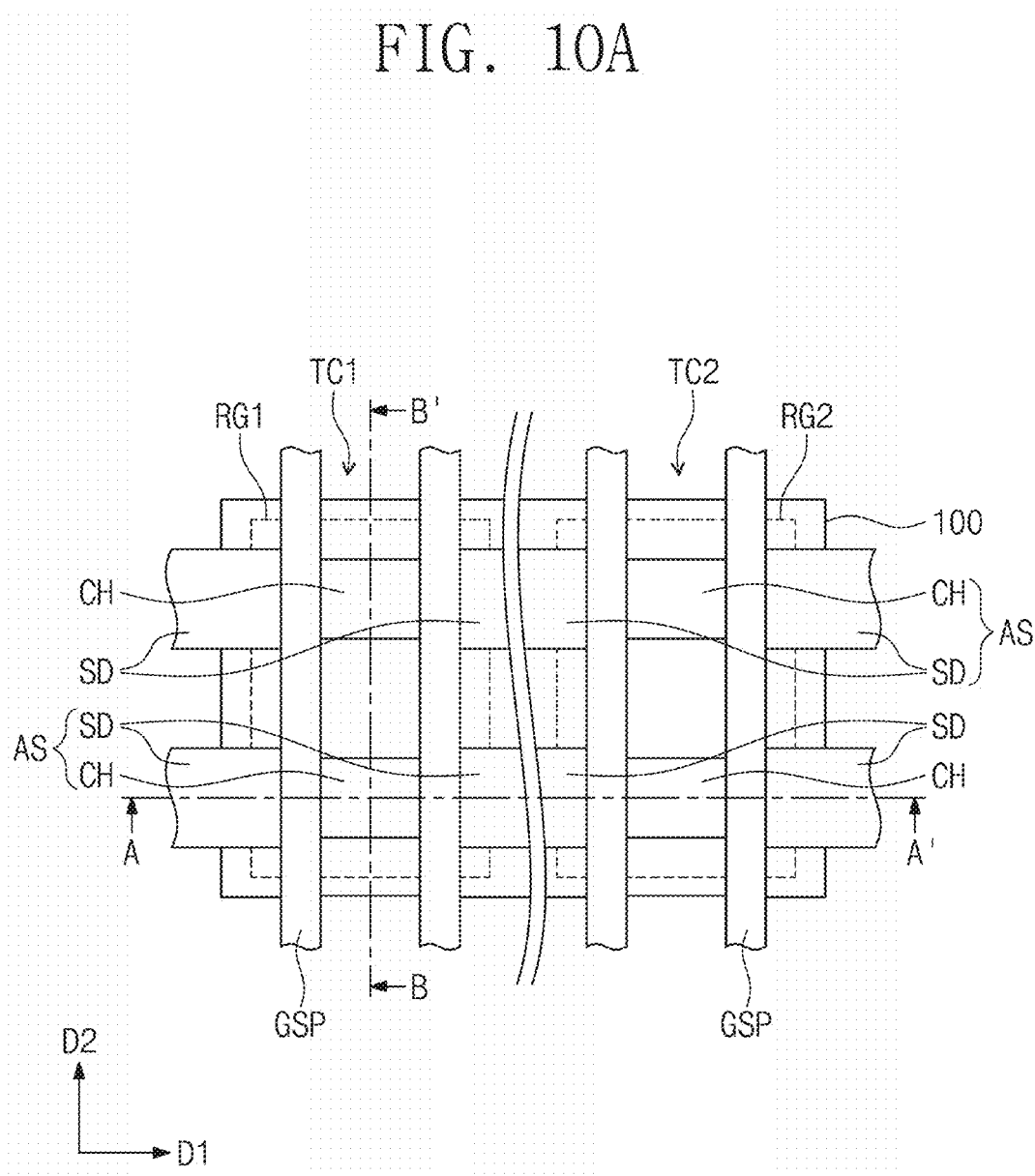

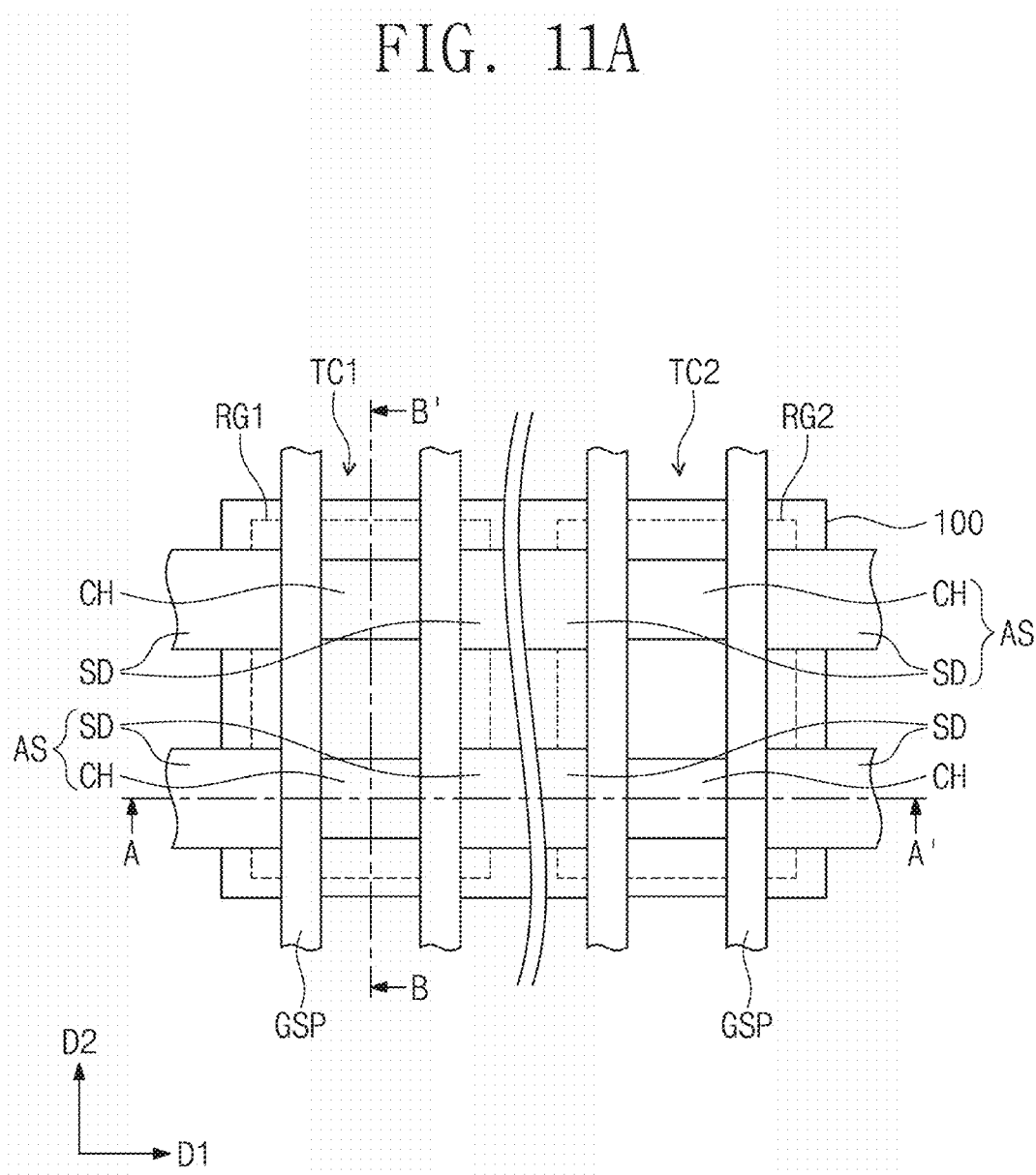

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2019-0063033, filed on May 29, 2019, in the Korean Intellectual Property Office, the entire contents of which are hereby incorporated by reference.

BACKGROUND

The present disclosure relates to a semiconductor device and a method of fabricating the same, and in particular, to a semiconductor device including a gate-all-around type transistor and a method of fabricating the same.

Due to their small-sized, multifunctional, and/or low-cost characteristics, semiconductor devices are being esteemed as important elements in the electronic industry. The semiconductor devices are classified into a memory device for storing data, a logic device for processing data, and a hybrid device including both of memory and logic elements. To meet the increased demand for electronic devices with fast speed and/or low power consumption, it is necessary to realize semiconductor devices with high reliability, high performance, and/or multiple functions. To satisfy these technical requirements, complexity and/or integration density of semiconductor devices are being increased.

SUMMARY

An embodiment of inventive concepts provides a semiconductor device with improved electric characteristics and a method of fabricating the same.

According to an embodiment of inventive concepts, a method of fabricating a semiconductor device may include forming an active pattern on a substrate, the active pattern including sacrificial patterns and semiconductor patterns that are alternately and repeatedly stacked on the substrate, forming an interlayered insulating layer on the substrate to cover the active pattern and define a gate region, in which a gate electrode crossing the active pattern will be formed, removing the sacrificial patterns, sequentially depositing a dielectric layer, a first work function adjusting pattern, and a second work function adjusting pattern, the dielectric layer, the first work function adjusting pattern, and the second work function adjusting pattern sequentially enclosing surfaces of the active patterns exposed in the gate region, and filling the gate region with a conductive material. The forming of the first work function adjusting pattern and the forming of the second work function adjusting pattern may be performed in an in-situ manner.

According to an embodiment of inventive concepts, a method of fabricating a semiconductor device may include forming an active pattern on a substrate, the active pattern including sacrificial patterns and semiconductor patterns, that are alternately and repeatedly stacked; forming a sacrificial gate pattern to cross the active pattern; forming gate spacers at both sides of the sacrificial gate pattern; removing each of the sacrificial patterns between the gate spacers and the sacrificial gate pattern to form an empty space; and forming a gate electrode in the empty space. The forming of the gate electrode includes sequentially depositing a dielectric layer, a first work function adjusting pattern, and a second work function adjusting pattern on outer perimeter surfaces of the semiconductor patterns exposed in the empty space, and the first work function adjusting pattern may be in contact with the second work function adjusting pattern.

According to an embodiment of inventive concepts, a method of fabricating a semiconductor device may include forming a first active pattern and a second active pattern on a substrate, each of the first and second active patterns including sacrificial patterns and semiconductor patterns, which are alternately and repeatedly stacked, forming a sacrificial gate pattern to cross the first and second active patterns, forming gate spacers on opposite side surfaces of the sacrificial gate pattern, removing the sacrificial patterns between the gate spacers and the sacrificial gate pattern to form an empty space, forming a first work function adjusting pattern, which encloses the semiconductor patterns of the first active pattern, in the empty space, forming a second work function adjusting pattern, which encloses the semiconductor patterns of the second active pattern, in the empty space, and forming a third work function adjusting pattern, which encloses the semiconductor patterns of the first and second active patterns, in the empty space. The forming of the second work function adjusting pattern and the forming of the third work function adjusting pattern may be successively performed in the same process chamber.

According to an embodiment of inventive concepts, a semiconductor device may include a substrate; a channel pattern stacked on the substrate, the channel pattern including semiconductor patterns; and a gate electrode on the substrate, the gate electrode extending to cross the channel pattern. The gate electrode may include dielectric layers, first work function adjusting patterns, and second work function adjusting patterns. The dielectric layer may enclose the semiconductor patterns, respectively. The first work function adjusting patterns may enclose the dielectric layers, respectively, and the second work function adjusting patterns may enclose the first work function adjusting patterns, respectively. The first work function adjusting patterns may be formed of an aluminum-containing material, and each corresponding one of the first work function adjusting patterns may be in contact with a corresponding one of the second work function adjusting patterns enclosing the enclose the corresponding one of the first work function adjusting patterns.

According to an embodiment of inventive concepts, a semiconductor device may include a substrate; a first active structure and a second active structure on the substrate, each of the first active structure and the second active structure being spaced apart from each other, each of the of the first active structure and the second active structure including semiconductor patterns stacked on the substrate; a first gate electrode crossing the first active structure; and a second gate electrode crossing the second active structure. The first gate electrode may include a first dielectric layer enclosing the semiconductor patterns of the first active structure, a first work function adjusting pattern enclosing the first dielectric layer, and a second work function adjusting pattern enclosing the first work function adjusting pattern. The second gate electrode may include a second dielectric layer enclosing the semiconductor patterns of the second active structure and a third work function adjusting pattern enclosing the second dielectric layer. A content of oxygen (O) in the first work function adjusting patterns may range from 0% to 30%, and the first work function adjusting pattern may be in direct contact with the second work function adjusting pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1A is a plan view illustrating a semiconductor device according to an embodiment of inventive concepts.

FIG. 2A is a plan view illustrating a semiconductor device according to an embodiment of inventive concepts.

FIG. 2C is a sectional view taken along a line D-D' of FIG. 2A.

FIGS. 3A to 11A are plan views illustrating a method of fabricating a semiconductor device according to an embodiment of inventive concepts.

FIGS. 3B to 11B are sectional views taken along lines A-A' of FIGS. 3A to 11A, respectively.

FIGS. 3C to 11C are sectional views taken along lines B-B' of FIGS. 3A to 11A, respectively.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown.

Figure 1B:
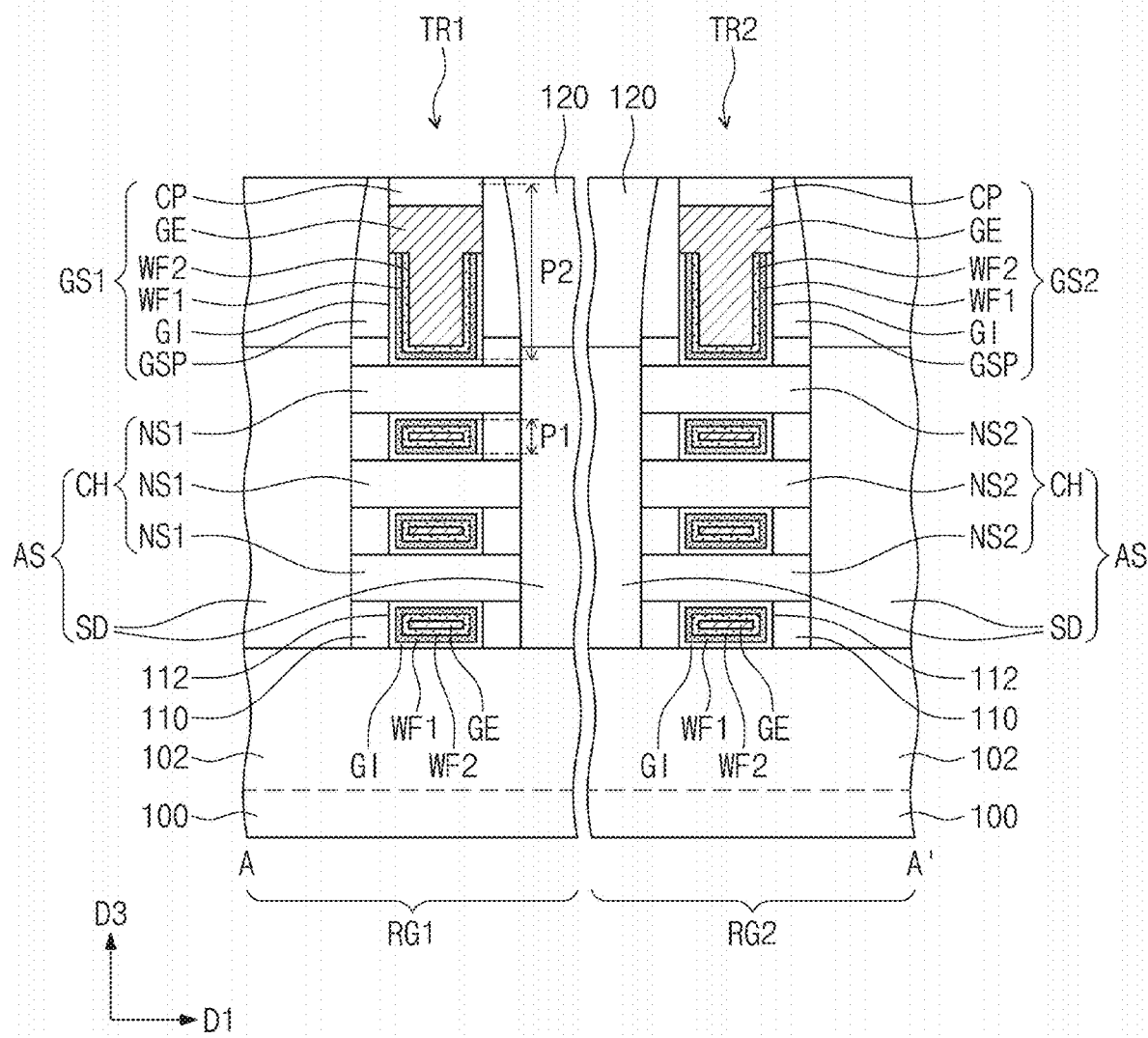
FIG. 1B is a sectional view taken along a line A-A' of FIG. 1A.
Figure 1C:
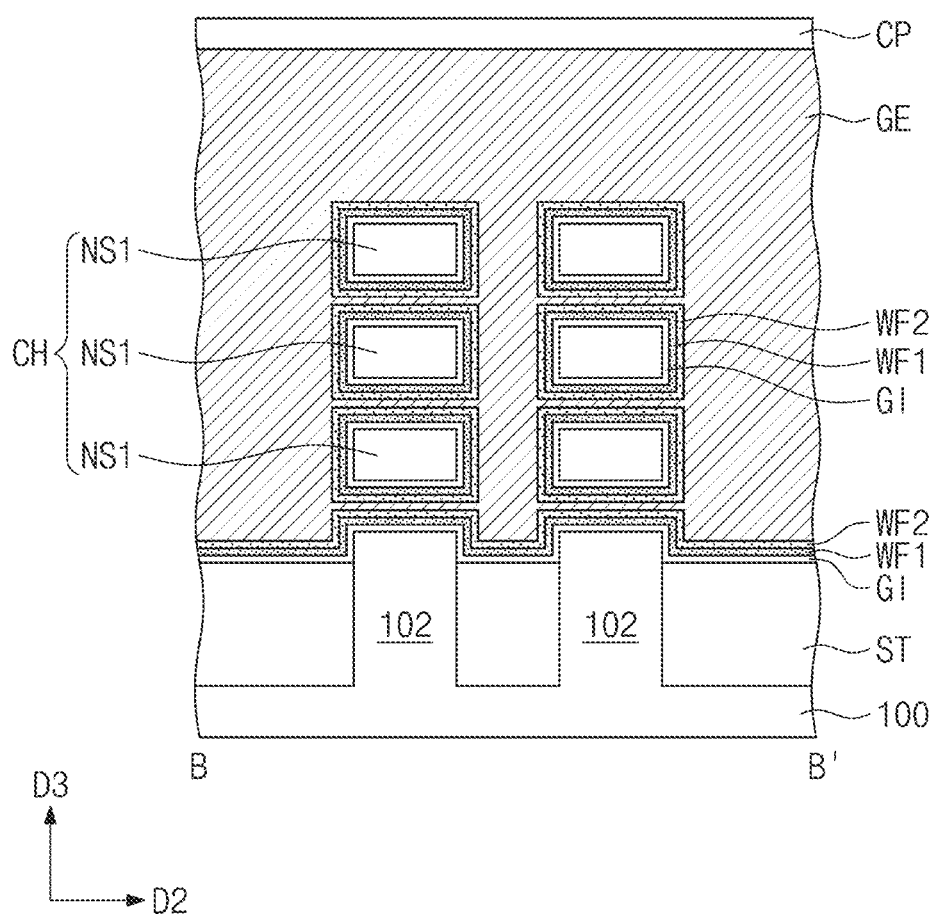
FIG. 1C is a sectional view taken along a line B-B' of FIG. 1A.

FIG. 1A is a plan view illustrating a semiconductor device according to an embodiment of inventive concepts. FIG. 1B is a sectional view taken along a line A-A' of FIG. 1A. FIG. 1C is a sectional view taken along a line B-B' of FIG. 1A.

Referring to FIGS. 1A to 1C, a substrate 100 including a first region RG1 and a second region RG2 may be provided. The substrate 100 may be a semiconductor substrate. For example, the substrate 100 may be a silicon (Si) or germanium (Ge) wafer. In certain embodiments, the substrate 100 may be a silicon-on-insulator (SOI) wafer. The first and second regions RG1 and RG2 of the substrate 100 may be disposed side by side in a first direction D1. The first and second regions RG1 and RG2 of the substrate 100 may be regions, on which first transistors TR1 and second transistors TR2 are respectively provided.

Hereinafter, the first direction D1 and a second direction D2 may be defined to be parallel to a top surface of the substrate 100 and to be perpendicular to each other, and a third direction D3 may be defined to be perpendicular to the top surface of the substrate 100.

In an embodiment, the first and second regions RG1 and RG2 of the substrate 100 may be a memory cell region, on which a plurality of memory cells to store data are formed. For example, memory cell transistors constituting a plurality of SRAM cells may be disposed on the memory cell region of the substrate 100. The first and second transistors TR1 and TR2 may be some of the memory cell transistors.

In certain embodiments, the first and second regions RG1 and RG2 of the substrate 100 may be a logic cell region, on which logic transistors constituting a logic circuit of the semiconductor device are disposed. For example, the logic transistors may be disposed on the logic cell region of the substrate 100. The first and second transistors TR1 and TR2 may be some of the logic transistors. However, inventive concepts are not limited to these examples.

The first and second transistors TR1 and TR2 on the first and second regions RG1 and RG2 may have the same conductivity type. For example, the first and second transistors TR1 and TR2 on the first and second regions RG1 and RG2 may be NMOSFETs. As another example, the first and second transistors TR1 and TR2 on the first and second regions RG1 and RG2 may be PMOSFETs. In certain embodiments, the first and second transistors TR1 and TR2 may have different conductivity types from each other. For example, the first transistors TR1 on the first regions RG1 may be NMOSFETs, and the second transistors TR2 on the second regions RG2 may be PMOSFETs.

A base active pattern 102 may be provided on the substrate 100. The base active pattern 102 may protrude from the substrate 100 in the third direction D3. The base active pattern 102 may be extended in the first direction D1. In an embodiment, a plurality of the base active patterns 102 may be provided, as shown in FIGS. 1A and 1C, and the plurality of the base active patterns 102 may be arranged in the second direction D2.

A device isolation layer ST may be provided on the substrate 100 and at both sides of each of the base active patterns 102. The device isolation layer ST may be extended in the first direction D1. The device isolation layer ST may fill a space between the base active patterns 102. The device isolation layer ST may expose upper sidewalls of the base active patterns 102. For example, a top surface of the device isolation layer ST may be located at a level lower than a top surface of the base active patterns 102. The device isolation layer ST may be formed of or include oxide, nitride, or oxynitride.

Active structures AS may be provided on the base active patterns 102. The active structures AS may be overlapped with the base active patterns 102, when viewed in a plan view. Each of the active structures AS may be a line-shaped structure extending in the first direction D1. For example, the active structures AS may be extended along the top surface of the base active patterns 102 and in the first direction D1.

Each of the active structures AS may include a channel pattern CH and source/drain patterns SD. The channel pattern CH may be interposed between a pair of the source/drain patterns SD. The channel pattern CH and the source/drain patterns SD may be arranged along the top surface of the base active pattern 102 and in the first direction D1. The channel pattern CH of the first region RG1 may include a plurality of first semiconductor patterns NS1, which are vertically stacked. The channel pattern CH of the second region RG2 may include a plurality of second semiconductor patterns NS2, which are vertically stacked.

The first semiconductor patterns NS1 may be spaced apart from each other in the third direction D3. The lowermost one of the first semiconductor patterns NS1 may be spaced apart from the base active pattern 102 in the third direction D3. The separation distance of the first semiconductor patterns NS1 in the third direction D3 may range from 1 nm to 15 nm. Each of the source/drain patterns SD may be in direct contact with sidewalls of the first semiconductor patterns NS1. In other words, the first semiconductor patterns NS1 may connect an adjacent pair of the source/drain patterns SD to each other. FIGS. 1B and 1C illustrate an example, in which the number of the first semiconductor patterns NS1 of the channel pattern CH of the first region RG1 is three, but inventive concepts are not limited to this example. The first semiconductor patterns NS1 may have the same thickness or different thicknesses from each other. The first semiconductor patterns NS1 may be formed of or include at least one of silicon (Si), silicon germanium (SiGe), or germanium (Ge). The first semiconductor patterns NS1 may be doped with impurities, if necessary. For example, in the case where the first transistors TR1 are NMOFETs, the impurities may be boron (B). In the case where the first transistors TR1 are PMOSFETs, the impurities may be phosphorus (P).

The second semiconductor patterns NS2 may be configured to have substantially the same features as the first semiconductor patterns NS1 described above. In the case where the first and second transistors TR1 and TR2 have different conductivity types from each other, the second semiconductor patterns NS2 may be doped with impurities, which are different from those in the first semiconductor patterns NS1.

The first and second semiconductor patterns NS1 and NS2, which are positioned at the same level, may be formed from the same semiconductor layer. The first and second semiconductor patterns NS1 and NS2, which are positioned at the same level, may have substantially the same thickness. The first and second semiconductor patterns NS1 and NS2, which are positioned at the same level, may be formed of or include substantially the same semiconductor material.

The source/drain patterns SD may be epitaxial patterns, which are formed using the first and second semiconductor patterns NS1 and NS2 and the base active patterns 102 as a seed layer. For example, in the case where the first and second transistors TR1 and TR2 are NMOSFETs, the source/drain patterns SD may include a semiconductor material exerting a tensile strain on the channel pattern CH. As an example, the source/drain patterns SD may be formed of or include a semiconductor material, whose lattice constant is smaller than that of a semiconductor material of the channel pattern CH. In certain embodiments, the source/drain patterns SD may include the same semiconductor material as that of the channel pattern CH. In the case where the first and second transistors TR1 and TR2 are PMOSFETs, the source/drain patterns SD may include a material exerting a compressive strain on the channel pattern CH. As an example, the source/drain patterns SD may be formed of or include a semiconductor material, whose lattice constant is larger than that of the semiconductor material of the channel pattern CH.

The source/drain patterns SD may further include impurities. The impurities may be used to improve electric characteristics of the first and second transistors TR1 and TR2 including the source/drain patterns SD. In the case where the first and second transistors TR1 and TR2 are NMOFETs, the impurities may be phosphorus (P). In the case where the first and second transistors TR1 and TR2 are PMOSFETs, the impurities may be boron (B).

First and second gate structures GS1 and GS2 may be provided on the active structures AS. The first and second gate structures GS1 and GS2 may be provided to cross the channel patterns CH of the first and second regions RG1 and RG2, respectively, and may be extended in the second direction D2. The first and second gate structures GS1 and GS2 may be spaced apart from each other in the first direction D1. When viewed in a plan view, the channel patterns CH of the first region RG1 may be overlapped with the first gate structure GS1, and the channel patterns CH of the second region RG2 may be overlapped with the second gate structure GS2. The source/drain patterns SD may be provided at both sides of the first gate structure GS1 and at both sides of the second gate structure GS2.

The first and second gate structures GS1 and GS2 may include first and second work function adjusting patterns WF1 and WF2. The first and second gate structures GS1 and GS2 may include gate electrodes GE.

Each of the first and second gate structures GS1 and GS2 may have a first portion P1 and a second portion P2. The first portion P1 may be positioned in a space between the semiconductor patterns NS1 and NS2, which are adjacent to each other in a vertical direction. In other words, the first portion P1 may be a portion interposed between the semiconductor patterns NS1 and NS2, which are adjacent to each other in a vertical direction. The second portion P2 may be positioned in a space on the topmost semiconductor pattern NS1 and NS2. The space on the topmost semiconductor pattern NS1 and NS2 may be a space, which is surrounded by a pair of gate spacers GSP, which will be described below, and by the topmost semiconductor pattern NS1 and NS2. In other words, the second portion P2 may be a portion, which is positioned on the topmost semiconductor pattern NS1 and NS2 and is interposed between the pair of the gate spacers GSP.

In the first portion P1, each of the first work function adjusting patterns WF1 may cover a surface of a corresponding one of the first semiconductor patterns NS1. For example, as shown in FIG. 1C, the first work function adjusting patterns WF1 may enclose an outer perimeter surface of the first semiconductor patterns NS1 or may enclose an outer perimeter surface of the second semiconductor patterns NS2. Here, the outer perimeter surfaces of the semiconductor patterns NS1 and NS2 may mean side surfaces of the semiconductor patterns NS1 and NS2, which are exposed in the second direction D2, and top and bottom surfaces of the semiconductor patterns NS1 and NS2, which are exposed in the third direction D3. In other words, each of the first and second transistors TR1 and TR2 may be a gate-all-around type field effect transistor. The first work function adjusting pattern WF1 may include a metal compound having a relatively low work function. As an example, the first work function adjusting pattern WF1 may be a metal compound, which is doped with aluminum (Al) or contains aluminum (Al). In an embodiment, the first work function adjusting pattern WF1 may be formed of or include titanium aluminum carbide (TiAlC), titanium aluminum nitride (TiAlN), or tantalum aluminum nitride (TaAlN). Here, a content of oxygen (O) in the first work function adjusting pattern WF1 may range from 0% to 30%.

In the first portion P1, the first and second work function adjusting patterns WF1 and WF2 may be sequentially stacked on surfaces of the semiconductor patterns NS1 and NS2. For example, as shown in FIG. 1C, the first work function adjusting patterns WF1 may surround the outer perimeter surfaces of the semiconductor patterns NS1 and NS2, and the second work function adjusting patterns WF2 may surround the outer perimeter surfaces of the first work function adjusting patterns WF1. The second work function adjusting patterns WF2 may be in direct contact with the first work function adjusting patterns WF1. For example, an intervening layer, such as an oxide layer or a nitride layer, may not be interposed between the first and second work function adjusting patterns WF1 and WF2, which are sequentially stacked. The second work function adjusting pattern WF2 may include a metal compound having a relatively high work function. As an example, the second work function adjusting pattern WF2 may be formed of or include titanium nitride (TiN), titanium oxynitride (TiON), or tantalum nitride (TaN). In certain embodiments, the second work function adjusting pattern WF2 may have a multi-layered structure including a titanium oxynitride (TiON) layer and a titanium nitride (TiN) layer. In the case where the second work function adjusting pattern WF2 includes titanium oxynitride (TiON), a content of oxygen (O) in the second work function adjusting pattern WF2 may range from 30% to 60%.

The second portion P2 of the first and second gate structures GS1 and GS2 may be composed of the first and second work function adjusting patterns WF1 and WF2, which are sequentially stacked.

The gate electrodes GE in the first portion P1 may fill a space between the first semiconductor patterns NS1 and a space between the second semiconductor patterns NS2. In addition, the gate electrodes GE in the second portion P2 may be disposed on the first and second work function adjusting patterns WF1 and WF2. The gate electrodes GE may have electric resistance lower than the first and second work function adjusting patterns WF1 and WF2. For example, the gate electrodes GE may be formed of or include at least one of low resistance metals, such as aluminum (Al), tungsten (W), titanium (Ti), and tantalum (Ta).

A pair of the gate spacers GSP may be disposed on opposite side surfaces of each of the first and second gate structures GS1 and GS2. The gate spacers GSP may extend along the first and second gate structures GS1 and GS2 or in the second direction D2. Top surfaces of the gate spacers GSP may be higher than top surfaces of the gate electrode GE. The first and second work function adjusting patterns WF1 and WF2 on the channel patterns CH (i.e., the second portion P2) may extend along inner sidewalls of the gate spacers GSP or in the third direction D3. The gate spacers GSP may include at least one of silicon carbon nitride (SiCN) layer, a silicon carbon oxynitride (SiCON) layer, or a silicon nitride (SiN) layer or may have a single- or multi-layered structure.

Gate capping patterns CP may be provided on the first and second gate structures GS1 and GS2. The gate capping patterns CP may extend along the first and second gate structures GS1 and GS2 or in the second direction D2. Top surfaces of the gate capping patterns CP may be coplanar with the top surfaces of the gate spacers GSP. The gate capping patterns CP may be formed of or include at least one of silicon oxynitride (SiON), silicon carbon nitride (SiCN), or silicon nitride (SiN).

Spacer patterns 110 may be provided between the source/drain patterns SD and the first and second gate structures GS1 and GS2. The spacer patterns 110 may be provided on side surfaces of each of the first and second gate structures GS1 and GS2 and may be spaced apart from each other in the third direction D3. In other words, the spacer patterns 110 and the semiconductor patterns NS1 and NS2 may be alternately and repeatedly stacked in the third direction D3. Each of the spacer patterns 110 may be provided between adjacent ones of the semiconductor patterns NS1 and NS2 or between the lowermost one of the semiconductor pattern NS1 and NS2 and the base active pattern 102. The source/drain patterns SD may be in contact with the semiconductor patterns NS1 and NS2 and may be spaced apart from the first and second gate structures GS1 and GS2 with the spacer patterns 110 interposed therebetween. The spacer patterns 110 may electrically disconnect the first and second gate structures GS1 and GS2 from the source/drain patterns SD. The spacer patterns 110 may be formed of or include silicon nitride (SiN).

Gate dielectric layers GI (or referred to as dielectric layers) may be interposed between the first and second semiconductor patterns NS1 and NS2 and the first and second gate structures GS1 and GS2. Each of the gate dielectric layers GI may partially and conformally fill the space between the first semiconductor patterns NS1 or the space between the second semiconductor patterns NS2. The gate dielectric layers GI may be formed of or include at least one of high-k dielectric materials, whose dielectric constants are higher than that of silicon oxide. For example, the high-k dielectric materials may include at least one of hafnium oxide (HfO), hafnium silicon oxide (HfSiO), lanthanum oxide (LAO), zirconium oxide (ZrO), zirconium silicon oxide (ZrSiO), tantalum oxide (TaO), titanium oxide (TiO), barium strontium titanium oxide (BaSrTiO), barium titanium oxide (BaTiO), strontium titanium oxide (SrTiO), lithium oxide (LiO), aluminum oxide ($Al_2O_3$), lead scandium tantalum oxide (PbScTaO), and lead zinc niobate (PbZnNbO).

Here, a space between the gate dielectric layers GI, which are disposed to surround the first and second semiconductor patterns NS1 and NS2 adjacent to each other, may be less than or equal to 10 nm. In other words, a space, which is positioned between adjacent ones of the first and second semiconductor patterns NS1 and NS2 and is filled with the first and second work function adjusting patterns WF1 and WF2 and the gate electrodes GE, may have a thickness that is less than or equal to 10 nm. In the embodiments, the space, which is positioned between adjacent ones of the first and second semiconductor patterns NS1 and NS2, may range from 1 nm to 10 nm.

In the first and second transistors TR1 and TR2, a threshold voltage of the first transistor TR1 may be lower than a threshold voltage of the second transistor TR2. For example, the first work function adjusting pattern WF1 of the first transistor TR1 and the first work function adjusting pattern WF1 of the second transistor TR2 may be formed of or include different materials from each other.

The first work function adjusting pattern WF1 of the first transistor TR1 may include a metal compound having a relatively low work function. As an example, the first work function adjusting pattern WF1 of the first transistor TR1 may be a metal compound, which is doped with aluminum (Al) or contains aluminum (Al). In an embodiment, the first work function adjusting pattern WF1 of the first transistor TR1 may be formed of or include titanium aluminum carbide (TiAlC), titanium aluminum nitride (TiAlN), or tantalum aluminum nitride (TaAlN). By changing a doping concentration of aluminum (Al), which is used as dopants in the first work function adjusting pattern WF1 of the first transistor TR1, it may be possible to adjust a work function of the first work function adjusting pattern WF1 of the first transistor TR1.

The first work function adjusting pattern WF1 of the second transistor TR2 may include a metal compound having a high work function, compared with the first work function adjusting pattern WF1 of the first transistor TR1. As an example, the first work function adjusting pattern WF1 of the second transistor TR2 may be formed of or include titanium nitride (TiN), titanium oxynitride (TiON), or tantalum nitride (TaN). The first work function adjusting pattern WF1 of the second transistor TR2 may not substantially contain impurities (e.g., aluminum (Al) and so forth).

In an embodiment, the first and second transistors TR1 and TR2 may be transistors of different conductivity types. For example, the first transistors TR1 may be NMOSFETs, and the second transistors TR2 may be PMOSFETs. Here, the first work function adjusting pattern WF1 of the first transistor TR1 may include a material (e.g., titanium aluminum carbide (TiAlC) and so forth) having a low work function, and the first work function adjusting pattern WF1 of the second transistor TR2 may include a material (e.g., titanium oxynitride (TiON) or a multi-layered structure of titanium oxynitride (TiON) and titanium nitride (TiN), and so forth) having a high work function. However, inventive concepts are not limited to this example, and the first and second transistors TR1 and TR2 may transistors, which have different threshold voltages and have the same conductivity type.

In an embodiment, an intervening layer, such as an oxide layer or a nitride layer, may not be interposed between the first and second work function adjusting patterns WF1 and WF2, which are sequentially stacked. In the case where an intervening layer containing oxide or nitride is produced between the first and second work function adjusting patterns WF1 and WF2, an electric resistance between the first and second work function adjusting patterns WF1 and WF2 may be increased. In addition, dopants (i.e., aluminum (Al)) in the first work function adjusting pattern WF1 may be diffused into the intervening layer or the dopants of the first work function adjusting pattern WF1 may be oxidized to lead an increase in work function of the first work function adjusting pattern WF1. However, according to an embodiment of inventive concepts, any intervening layer may not be formed between the first and second work function adjusting patterns WF1 and WF2 and electric characteristics of the semiconductor device may be improved. This topic will be described in more detail along with a method of fabricating a semiconductor device.

The space between the first semiconductor patterns NS1 may be substantially the same as the space between the second semiconductor patterns NS2. A thickness of the first work function adjusting patterns WF1 in the first region RG1 may be substantially the same as a thickness of the first work function adjusting patterns WF1 in the second region RG2. In this case, by forming the first work function adjusting patterns WF1 of the first and second transistors TR1 and TR2 using different materials, the first and second transistors TR1 and TR2 may be formed to have different threshold voltages. In an embodiment, the first work function adjusting patterns WF1, which are provided on the first and second regions RG1 and RG2, respectively, may have different work functions from each other.

Figure 2B:
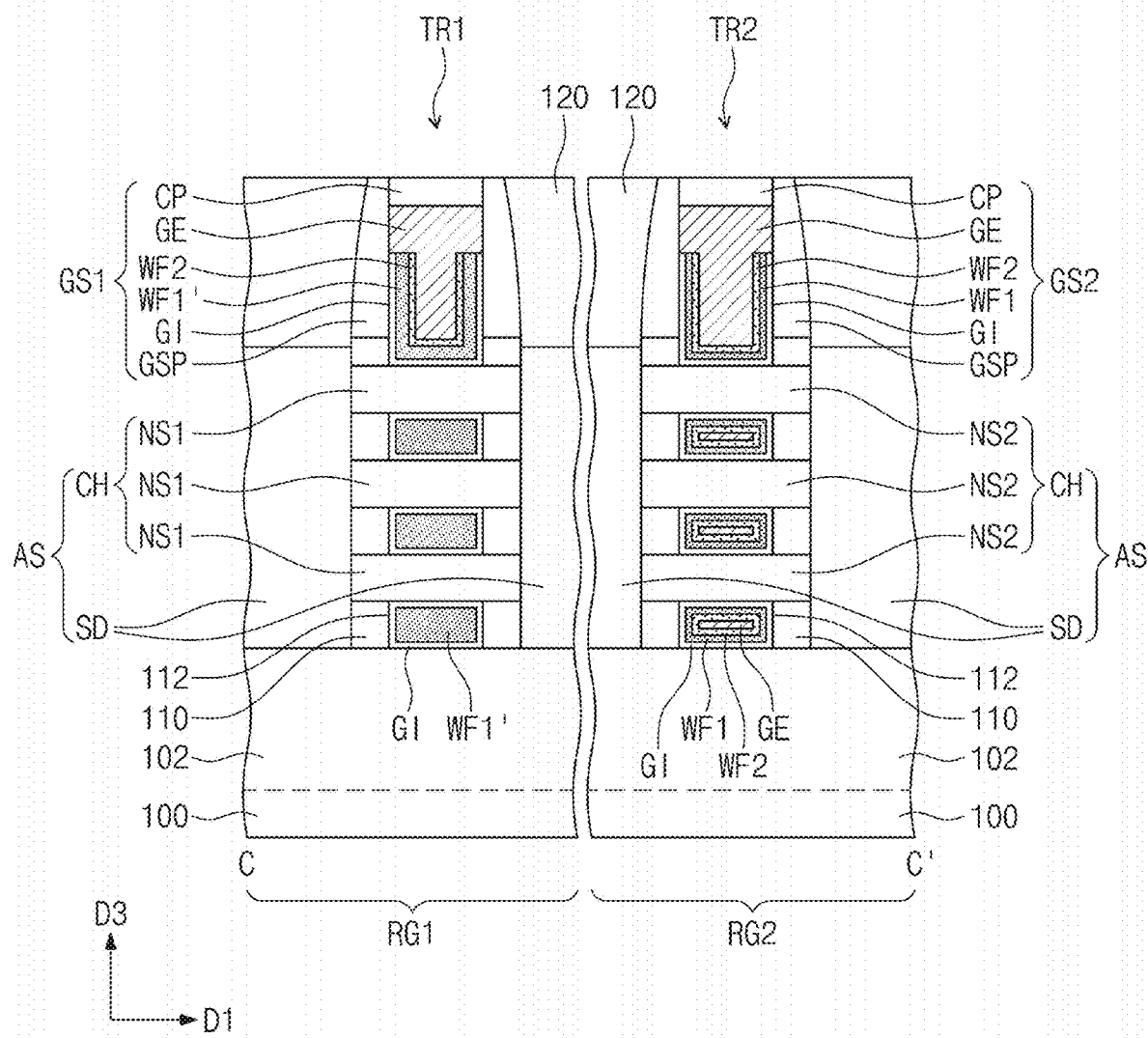
FIG. 2B is a sectional view taken along a line C-C' of FIG. 2A.

In certain embodiments, the first work function adjusting patterns WF1 may be formed to have different thicknesses on the first and second regions RG1 and RG2, respectively, and this may lead to a difference between the threshold voltages of the first and second transistors TR1 and TR2. FIG. 2A is a plan view illustrating a semiconductor device according to an embodiment of inventive concepts. FIG. 2B is a sectional view taken along a line C-C' of FIG. 2A, and FIG. 2C is a sectional view taken along a line D-D' of FIG. 2A. As shown in FIGS. 2A to 2C, a thickness of a first work function adjusting patterns WF1' on the first region RG1 may be thicker than a thickness of the first work function adjusting patterns WF1' on the second region RG2. Here, in the case where the thickness of the first work function adjusting pattern WF1' on the first region RG1 is sufficiently thick, the first work function adjusting pattern WF1' may fill the space between the first semiconductor patterns NS1. Accordingly, the second work function adjusting pattern WF2 and the gate electrode GE may not be extended into a space between the first semiconductor patterns NS1 and may be formed to enclose the channel pattern CH and the first work function adjusting pattern WF1' on the first region RG1. The first work function adjusting patterns WF1 on the first and second regions RG1 and RG2 may include the same material. As described above, in the case where the work function adjusting patterns WF1' and WF2 of the first and second regions RG1 and RG2 are formed to have different thicknesses, it may be possible to make a difference between the threshold voltages of the first and second transistors TR1 and TR2. The description that follows will refer to the embodiments shown in FIGS. 1A to 1C.

An interlayered insulating layer 120 may be provided on the entire top surface of the substrate 100. The interlayered insulating layer 120 may cover the device isolation layer ST, the first and second gate structures GS1 and GS2, and the source/drain patterns SD. A top surface of the interlayered insulating layer 120 may be substantially coplanar with the top surfaces of the gate capping patterns CP. The interlayered insulating layer 120 may be formed of or include silicon oxide (SiO) or silicon oxynitride (SiON).

Although not shown, contacts (not shown) may be provided to penetrated the interlayered insulating layer 120 and may be connected to the source/drain patterns SD or the gate structures GS1 and GS2. The contacts may be formed of or include at least one of metallic materials, such as tungsten (W), titanium (Ti), and tantalum (Ta).

FIGS. 3A to 11A are plan views illustrating a method of fabricating a semiconductor device according to an embodiment of inventive concepts. FIGS. 3B to 11B are sectional views taken along lines A-A' of FIGS. 3A to 11A, respectively. FIGS. 3C to 11C are sectional views taken along lines B-B' of FIGS. 3A to 11A, respectively. For convenience in description, some elements in FIGS. 3A to 11A may be omitted.

Figure 3B:
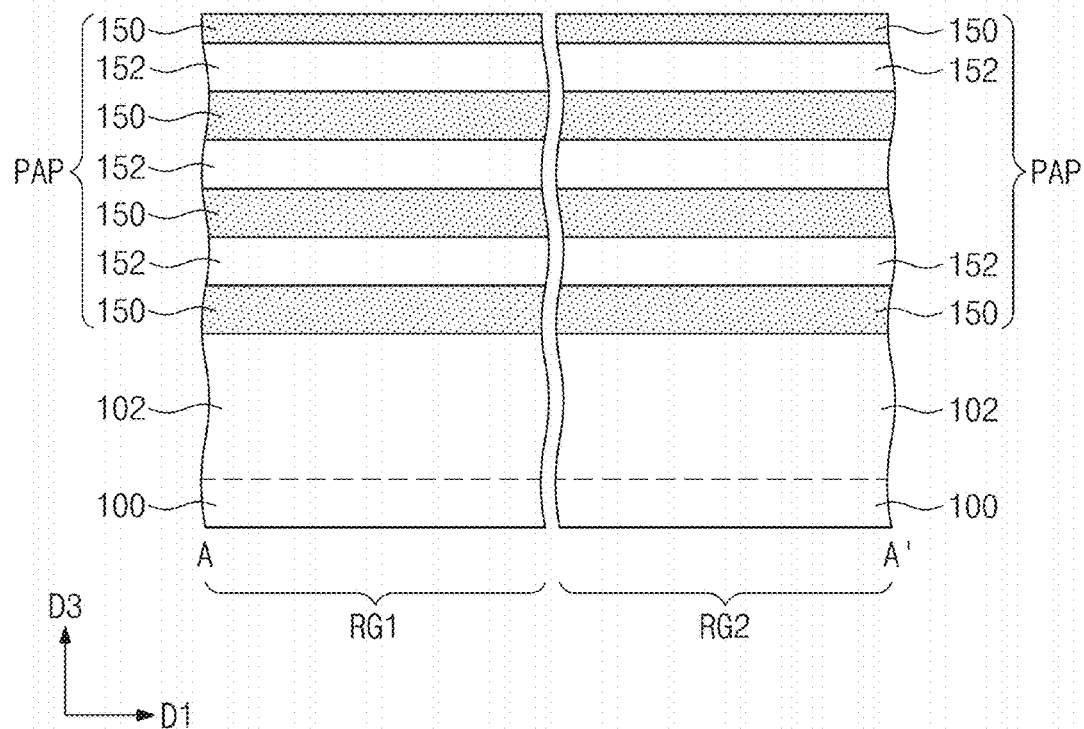
Figure 3C:
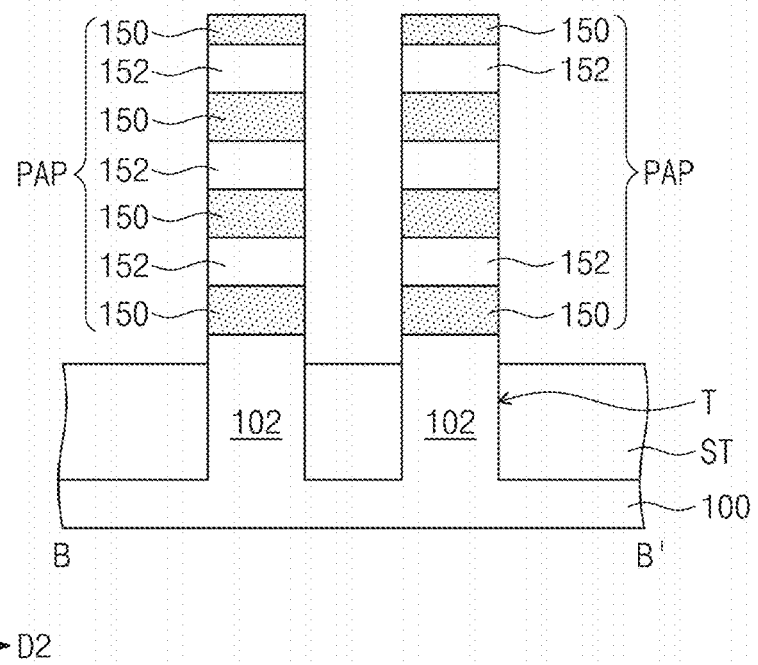

Referring to FIGS. 3A to 3C, sacrificial layers 150 and semiconductor layers 152 may be alternately and repeatedly stacked on the substrate 100. In FIGS. 3B and 3C, the semiconductor layers 152 is illustrated to be composed of stacked three layers, but inventive concepts are not limited to this example. The sacrificial layers 150 and the semiconductor layers 152 may be formed through an epitaxial growth process using the substrate 100 as a seed layer. The sacrificial layers 150 and the semiconductor layers 152 may be conformally grown from the entire top surface of the substrate 100. Each of the sacrificial layers 150 and semiconductor layers 152 may have a thickness in the third direction D3. The sacrificial layers 150 and the semiconductor layers 152 may be formed to have the same thickness as each other or to have different thicknesses from each other. The thickness of each of the sacrificial layers 150 may range from about 1 Å to about 100 nm, and the thickness of each of the semiconductor layers 152 may range from about 1 Å to about 100 nm. The sacrificial layers 150 may include silicon germanium (SiGe) or germanium (Ge), which has an etch selectivity with respect to the semiconductor layers 152, and the semiconductor layers 152 may include silicon (Si).

If necessary, the semiconductor layers 152 may be doped with impurities. For example, in the case where the first and second transistors TR1 and TR2 are formed of NMOFETs, the impurities may be boron (B). In the case where the first and second transistors TR1 and TR2 are formed of PMOS- FETs, the impurities may be phosphorus (P). If the first and second transistors TR1 and TR2 are formed of to have different conductivity types from each other, the semiconductor layers 152 in the first and second regions RG1 and RG2 may be doped with different impurities.

Preliminary active patterns PAP and the base active patterns 102 may be formed on the substrate 100. The formation of the preliminary active patterns PAP and the base active patterns 102 may include sequentially patterning the sacrificial layers 150, the semiconductor layers 152, and an upper portion of the substrate 100 to form trenches T, which define the preliminary active patterns PAP and the base active patterns 102. The trenches T may have a line shape extending in the first direction D1 and may be spaced apart from each other in the second direction D2. The preliminary active patterns PAP may be disposed on the base active patterns 102, respectively. The preliminary active patterns PAP may be formed to have a line or bar shape extending in the first direction D1.

The device isolation layer ST may be formed to fill the trenches T. The formation of the device isolation layer ST may include forming an insulating layer on the entire top surface of the substrate 100 and recessing the insulating layer to completely expose the preliminary active patterns PAP. Accordingly, the top surface of the device isolation layer ST may be lower than top surfaces of the base active patterns 102.

Figure 4A:
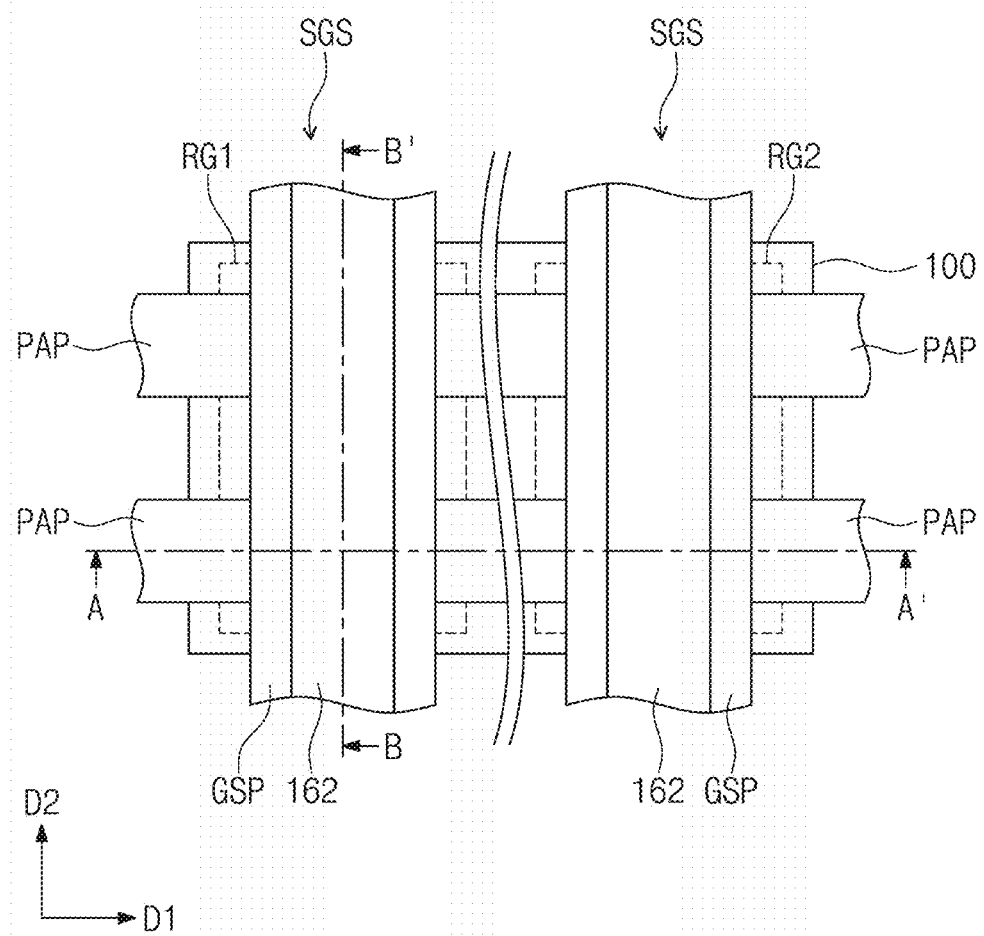
Figure 4B:
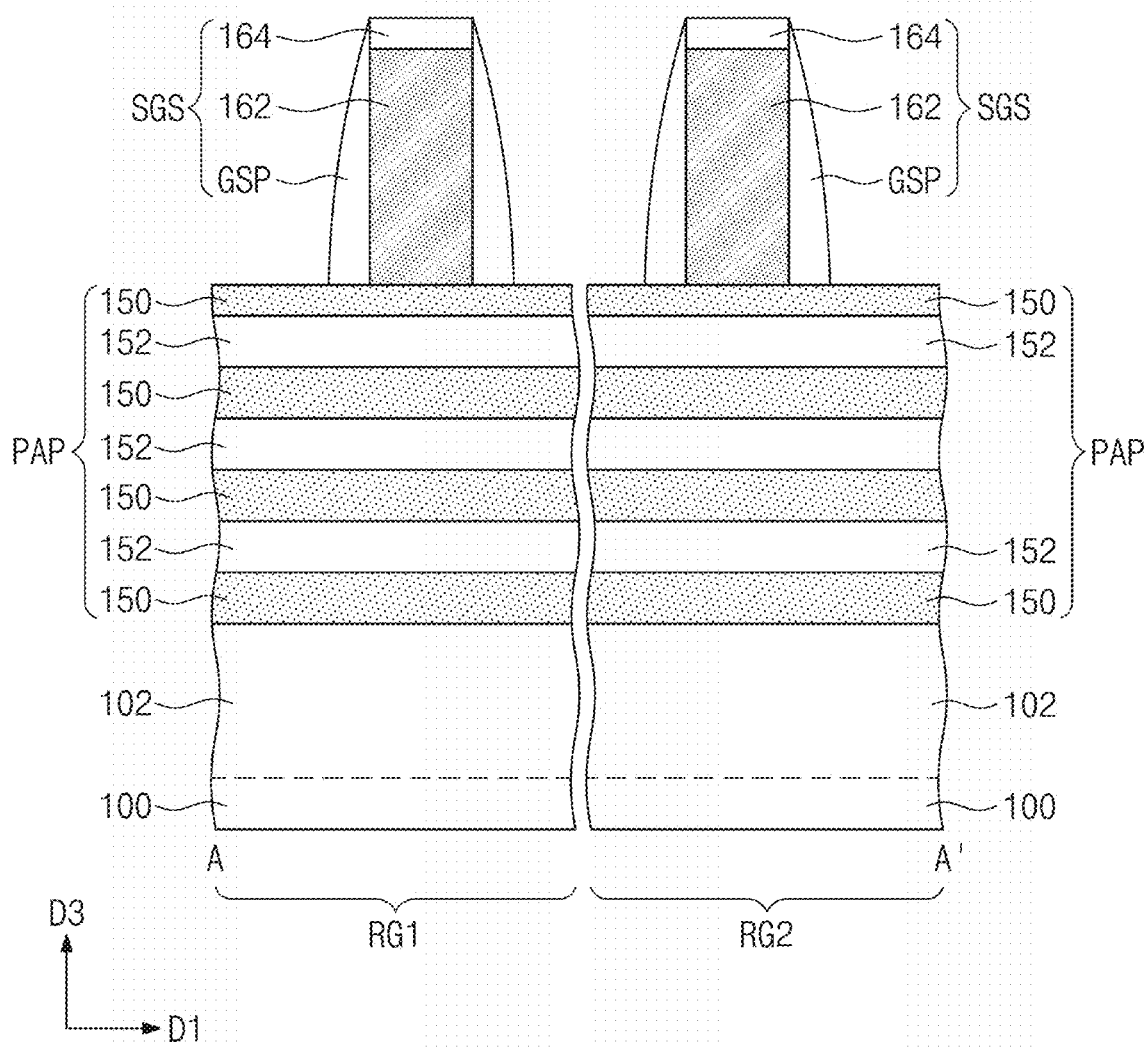
Figure 4C:
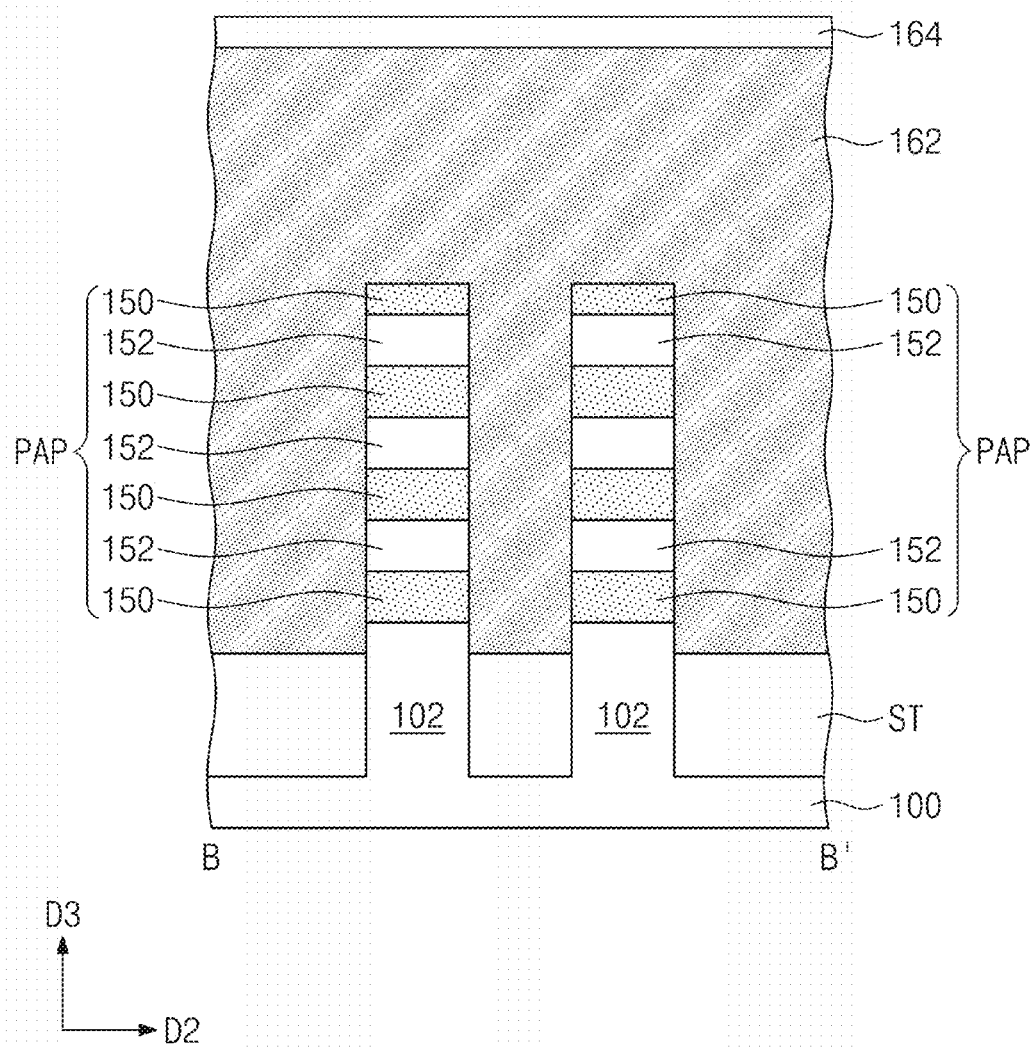

Referring to FIGS. 4A to 4C, sacrificial gate structures SGS may be formed to cross the preliminary active patterns PAP. The sacrificial gate structures SGS may extend in the second direction D2 and cross the base active patterns 102 and the device isolation layer ST. The sacrificial gate structures SGS may include a sacrificial gate pattern 162 and a gate mask pattern 164, which are sequentially stacked on the substrate 100. The formation of the sacrificial gate pattern 162 and the gate mask pattern 164 may include sequentially forming a sacrificial gate layer and a gate mask layer on the substrate 100 and sequentially patterning the sacrificial gate layer and the gate mask layer. The sacrificial gate layer may be formed of or include poly silicon. The gate mask layer may be formed of or include silicon nitride (SiN) or silicon oxynitride (SiON). The sacrificial gate structures SGS may have a line shape extending in the second direction D2. The sacrificial gate structures SGS may cover side surfaces of the preliminary active patterns PAP, which are opposite to each other in the second direction D2, and may cover top surfaces of the preliminary active patterns PAP and the top surface of the device isolation layer STs.

The sacrificial gate structures SGS may further include the gate spacers GSP. A pair of the gate spacers GSP may be respectively formed on opposite sides of each of the sacrificial gate structures SGS. The gate spacers GSP may be formed using silicon carbon nitride (SiCN), silicon carbon oxynitride (SiCON), or silicon nitride (SiN). The formation of the gate spacers GSP may include forming a spacer layer using a deposition process (e.g., a CVD or ALD process) and performing an anisotropic etching process on the spacer layer.

Figure 5A:
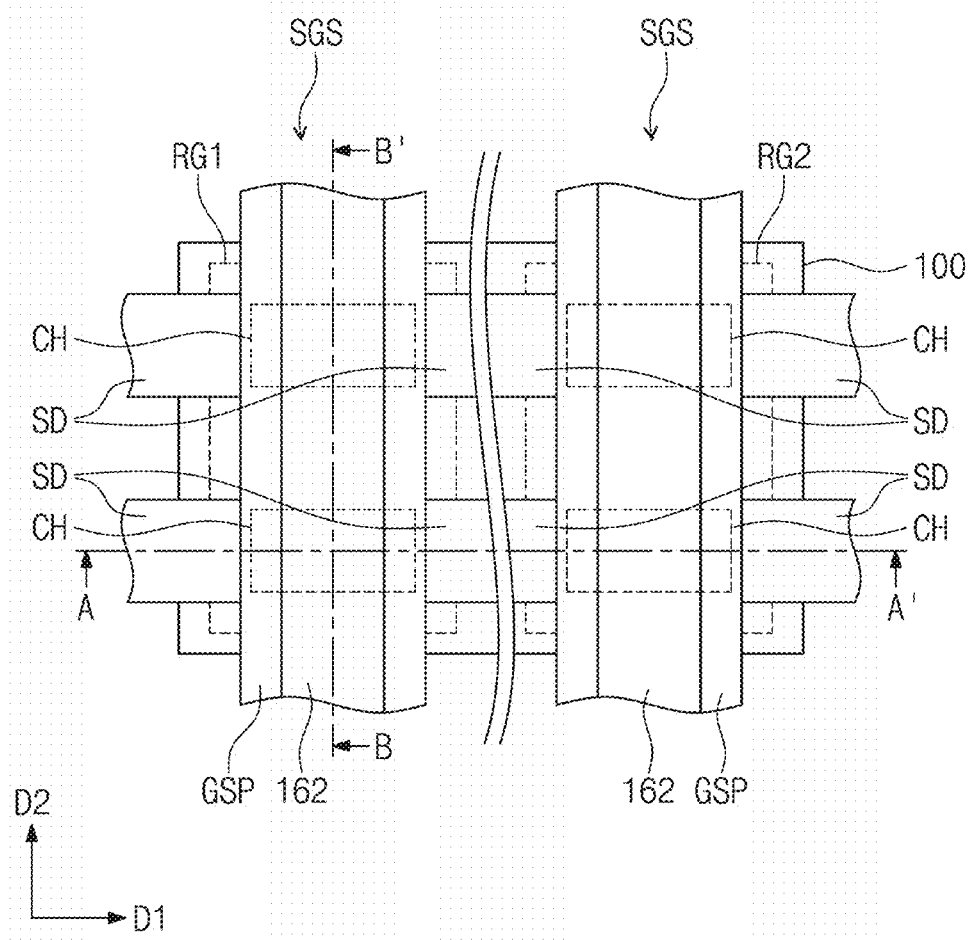
Figure 5B:
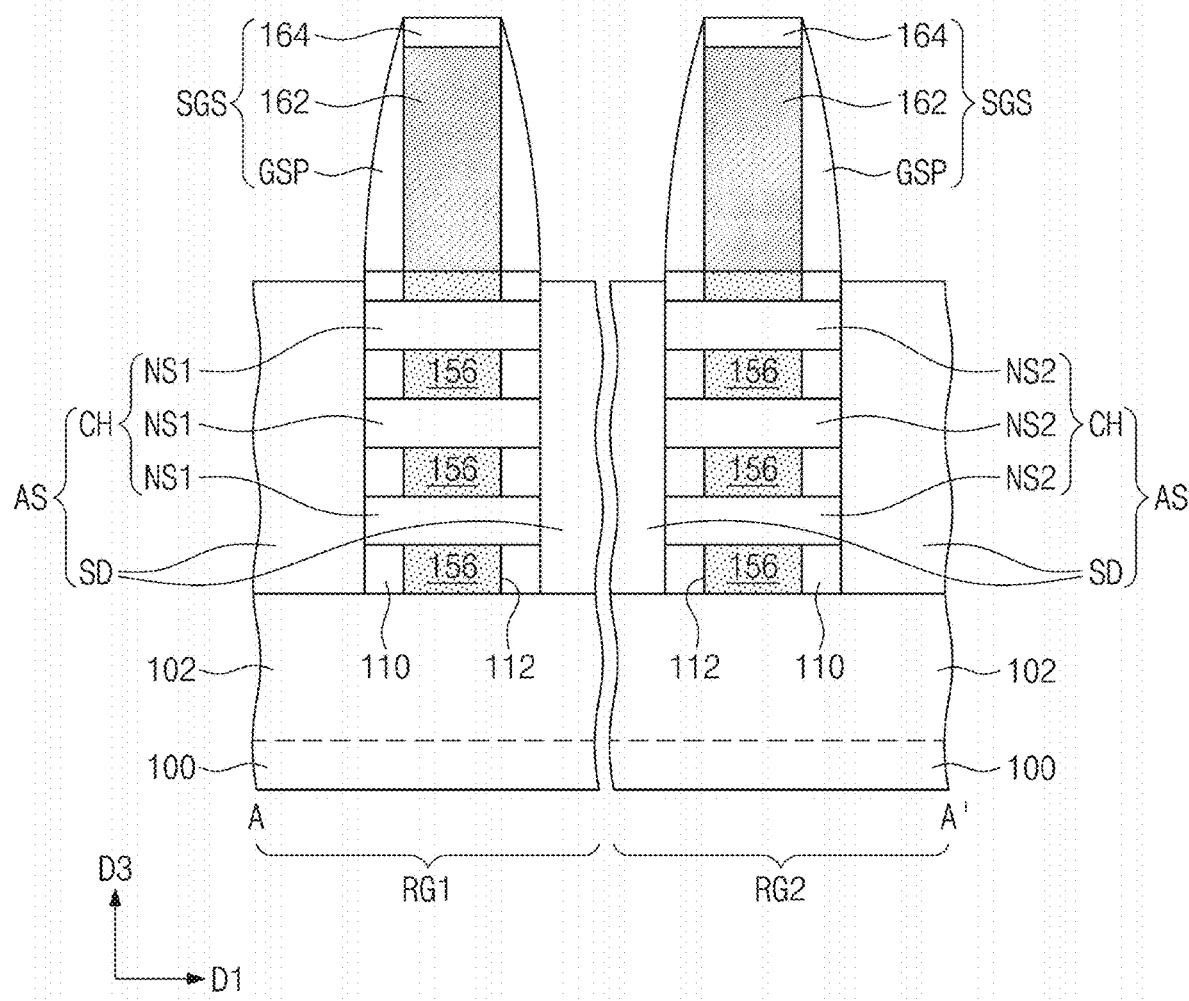
Figure 5C:
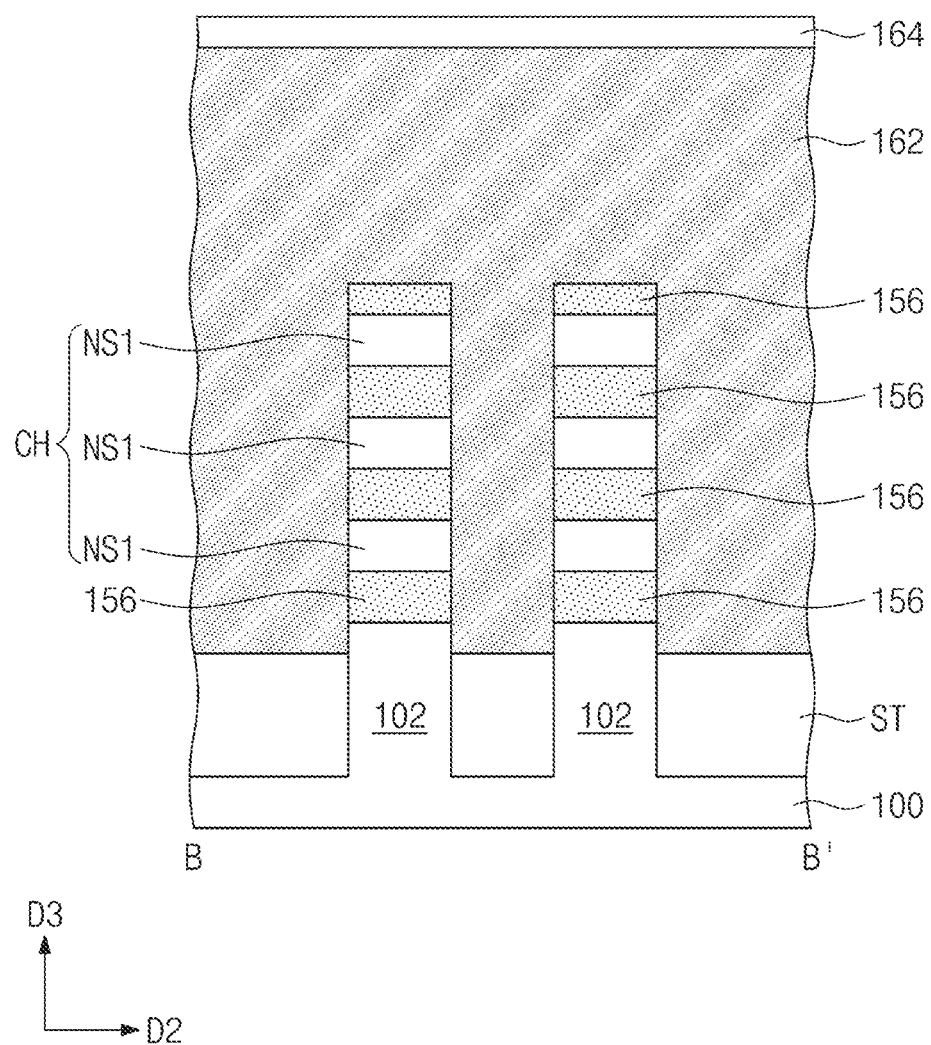

Referring to FIGS. 5A to 5C, the preliminary active patterns PAP may be patterned to form the channel patterns CH. The preliminary active patterns PAP may be patterned using gate mask patterns 164 and the gate spacers GSP as an etch mask. Thus, the base active patterns 102 may be partially exposed by the gate mask patterns 164 and the gate spacers GSP.

In detail, the sacrificial layers 150 of the preliminary active patterns PAP may be patterned to form sacrificial patterns 156. The semiconductor layers 152 of the preliminary active patterns PAP may be patterned to form the first and second semiconductor patterns NS1 and NS2. The first semiconductor patterns NS1 may constitute the channel pattern CH of the first region RG1, and the second semiconductor patterns NS2 may constitute the channel pattern CH of the second region RG2.

After the patterning process, exposed portions of the sacrificial patterns 156 may be horizontally removed to form recess regions 112. The formation of the recess regions 112 may include performing an etching process, in which an etch source having an etch selectivity with respect to the sacrificial patterns 156 is used.

The spacer patterns 110 may be formed to fill the recess regions 112. The spacer patterns 110 may be vertically spaced apart from each other, with the first and second semiconductor patterns NS1 and NS2 interposed therebetween. In detail, an insulating layer may be conformally formed on the entire top surface of the substrate 100. The insulating layer may fill the recess regions 112. Thereafter, the insulating layer may be etched such that the spacer patterns 110 are locally left only in the recess regions 112.

The source/drain patterns SD may be formed at both sides of each of the channel patterns CH. In detail, a selective epitaxial process, in which the first and second semiconductor patterns NS1 and NS2 and the base active patterns 102 are used as a seed layer, may be performed to form the source/drain patterns SD. The channel patterns CH and the source/drain patterns SD may be connected to each other.

In an embodiment, the source/drain patterns SD may be formed of the same semiconductor material (e.g., silicon (Si)) as the channel pattern CH. During or after the selective epitaxial process, the source/drain patterns SD may be doped with n-type impurities. In addition, the source/drain patterns SD may be formed silicon germanium (SiGe), whose lattice constant is larger than silicon (Si). During or after the selective epitaxial process, p-type impurities may be doped into the source/drain patterns SD.

Figure 6A:
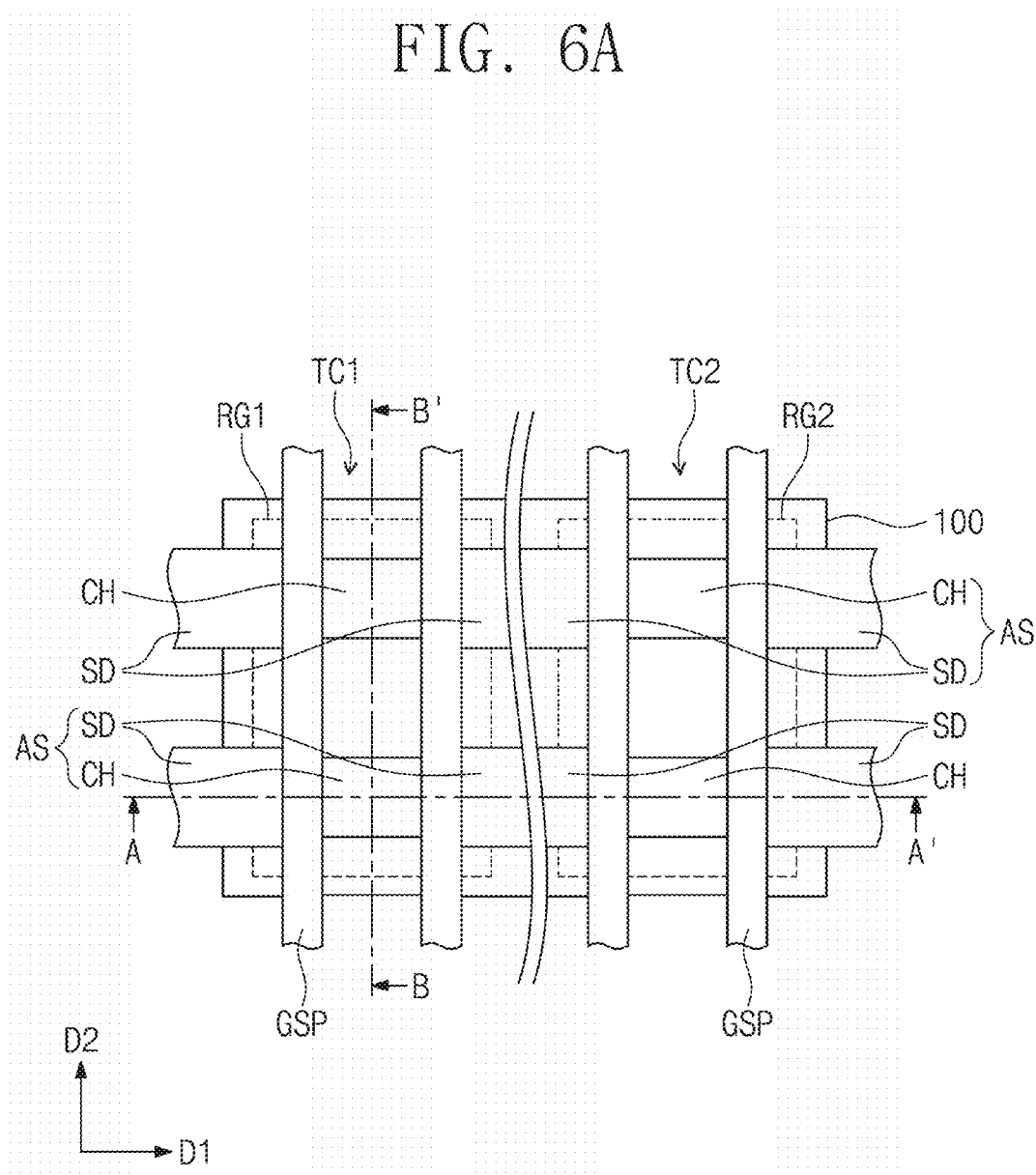
Figure 6B:
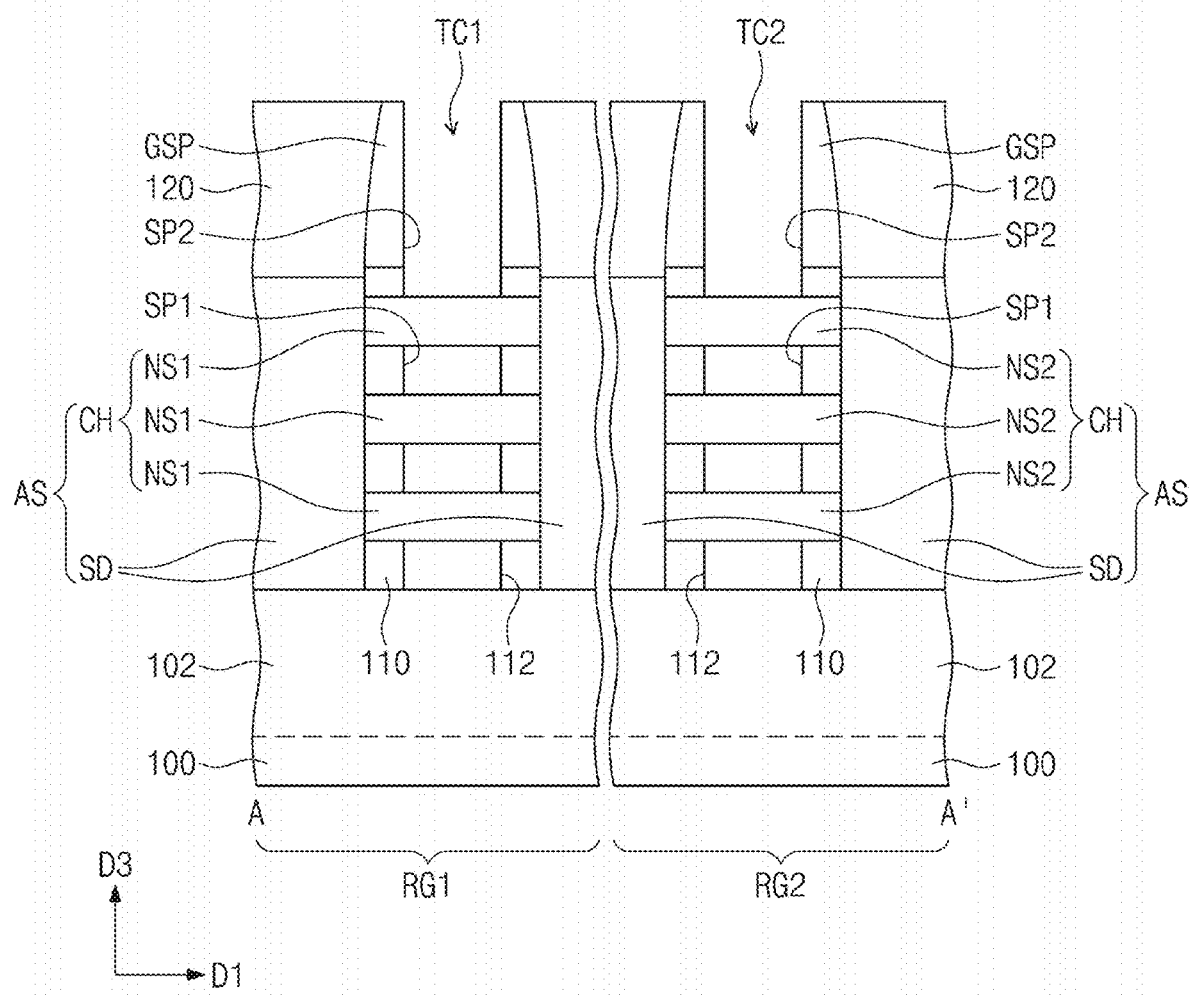
Figure 6C:
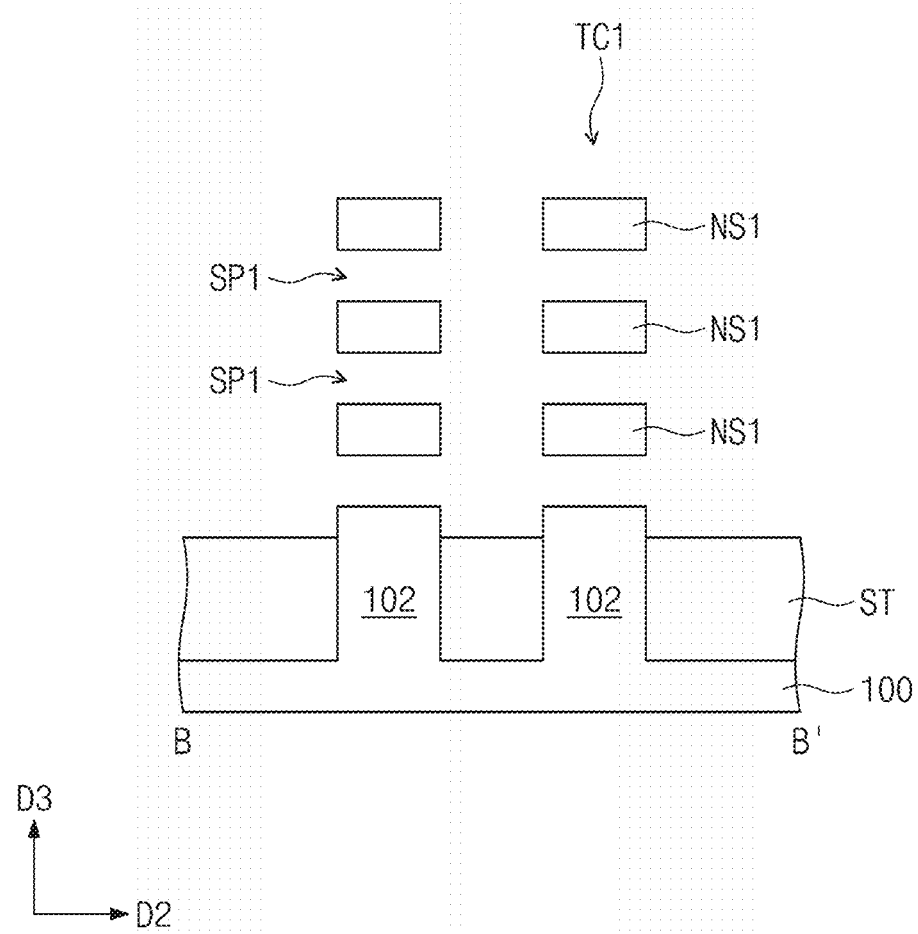

Referring to FIGS. 6A to 6C, the interlayered insulating layer 120 may be formed on the entire top surface of the substrate 100. Thereafter, a process of planarizing the interlayered insulating layer 120 may be performed to expose the top surfaces of the sacrificial gate patterns 162. The planarization process may include an etch-back and/or chemical mechanical polishing (CMP) process. The gate mask patterns 164 may be removed along with the interlayered insulating layer 120, when the interlayered insulating layer 120 is planarized. The interlayered insulating layer 120 may be formed using silicon oxide (SiO) or silicon oxynitride (SiON).

The sacrificial gate patterns 162 exposed by the planarization process may be selectively removed. Since the sacrificial gate patterns 162 are removed, first and second trenches TC1 and TC2 may be formed on the first and second regions RG1 and RG2, respectively, of the substrate 100. The first and second trenches TC1 and TC2 may be empty regions defined by the gate spacers GSP. The first and second trenches TC1 and TC2 may expose the channel patterns CH. The first and second trenches TC1 and TC2 may expose the sacrificial patterns 156. The first and second trenches TC1 and TC2 may have line shapes extending in the second direction D2 and may expose the top surface of the device isolation layer ST, when viewed in a plan view.

The exposed sacrificial patterns 156 may be selectively removed. In the case where the sacrificial patterns 156 include silicon germanium (SiGe) and the first and second semiconductor patterns NS1 and NS2 include silicon (Si), the selective etching process may be performed using an etching solution containing peracetic acid. Here, the source/drain patterns SD may be protected by the spacer patterns 110 and the interlayered insulating layer 120. Since the sacrificial patterns 156 are selectively removed, first spaces SP1 and second spaces SP2 may be formed on the first and second regions RG1 and RG2. The first space SP1 may be a space between the semiconductor patterns NS1 and NS2, which are vertically adjacent to each other. The second space SP2 may be a space, which is enclosed by a pair of the gate spacers GSP and the lowermost one of the semiconductor pattern NS1 and NS2. The first and second spaces SP1 and SP2 may be connected to the first and second trenches TC1 and TC2 and may expose the first and second semiconductor patterns NS1 and NS2.

Figure 7C:
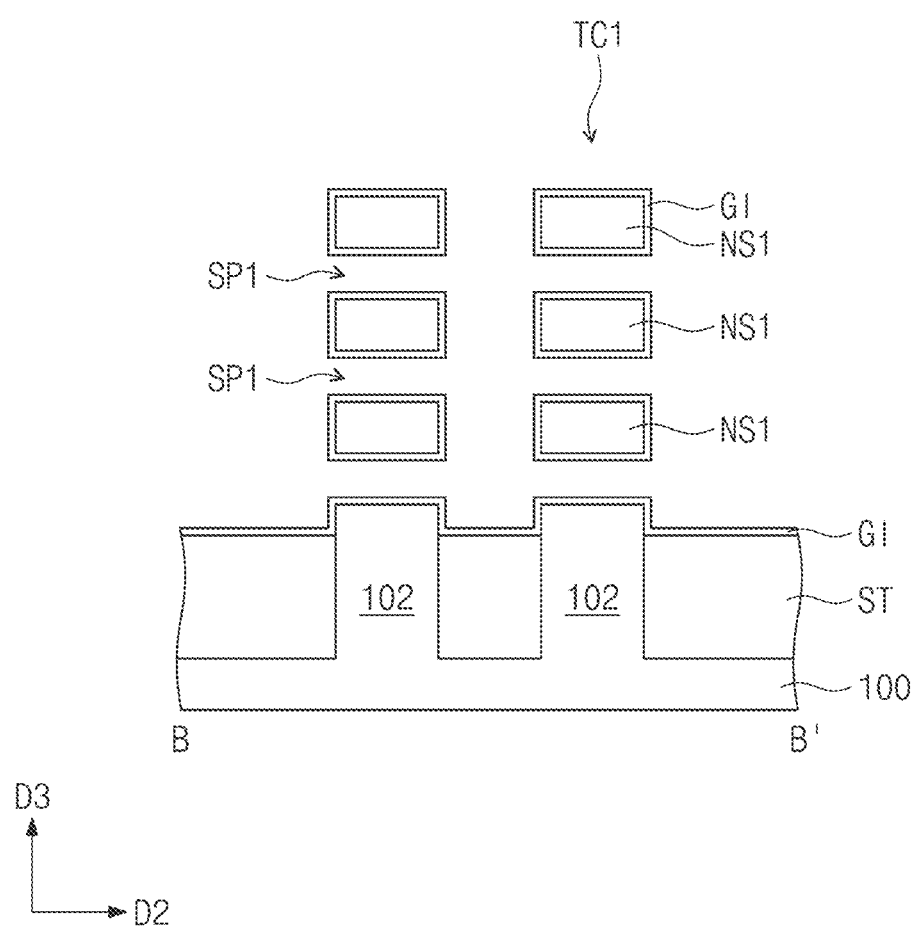

Referring to FIGS. 7A to 7C, the gate dielectric layers GI may be formed on the first and second semiconductor patterns NS1 and NS2, which are exposed by the first and second trenches TC1 and TC2. The gate dielectric layers GI may be formed to conformally cover inner surfaces of the first and second trenches TC1 and TC2. Each of the gate dielectric layers GI may partially fill the first spaces SP1 of the first and second trenches TC1 and TC2. Each of the gate dielectric layers GI may partially fill the second spaces SP2 of the first and second trenches TC1 and TC2. The gate dielectric layers GI may directly cover the spacer patterns 110 and the first and second semiconductor patterns NS1 and NS2. The gate dielectric layers GI may be formed using a high-k dielectric material having a dielectric constant higher than silicon oxide (SiO).

Although not shown, an oxidation process using plasma may be performed on the first and second semiconductor patterns NS1 and NS2, which are exposed by the first and second trenches TC1 and TC2, before the forming of the gate dielectric layers GI. As a result of this process, interface layers (not shown) may be grown from the exposed surfaces of the first and second semiconductor patterns NS1 and NS2. The formation of the interface layers (not shown) may include a thermal oxidation process and/or a chemical oxidation process. The oxidation process may be performed using plasma of at least one of oxygen, ozone, or steam. The interface layers (not shown) may be formed of silicon oxide (SiO). The interface layers (not shown) may directly enclose the exposed surfaces of the first and second semiconductor patterns NS1 and NS2.

Figure 8B:
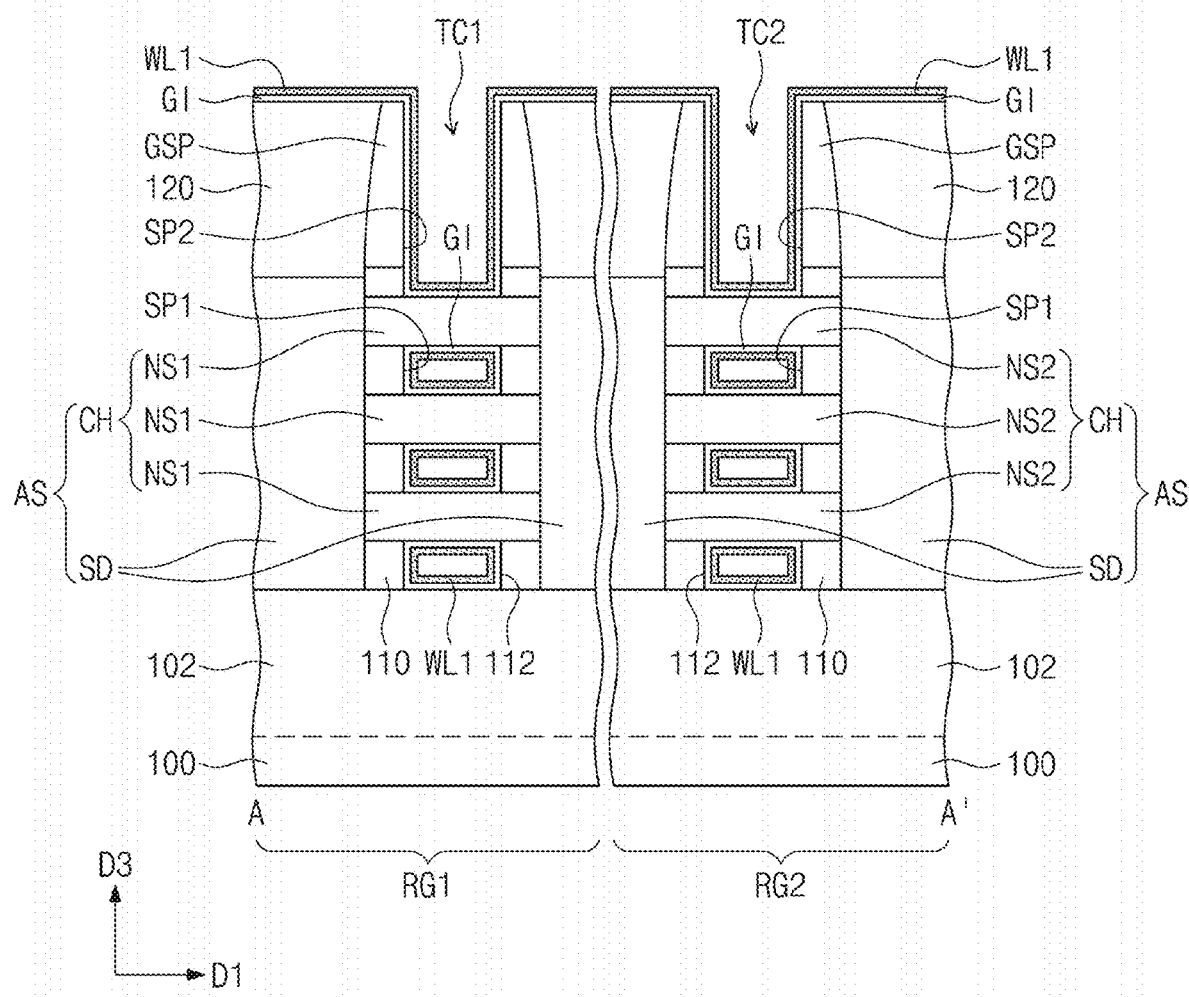
Figure 8C:
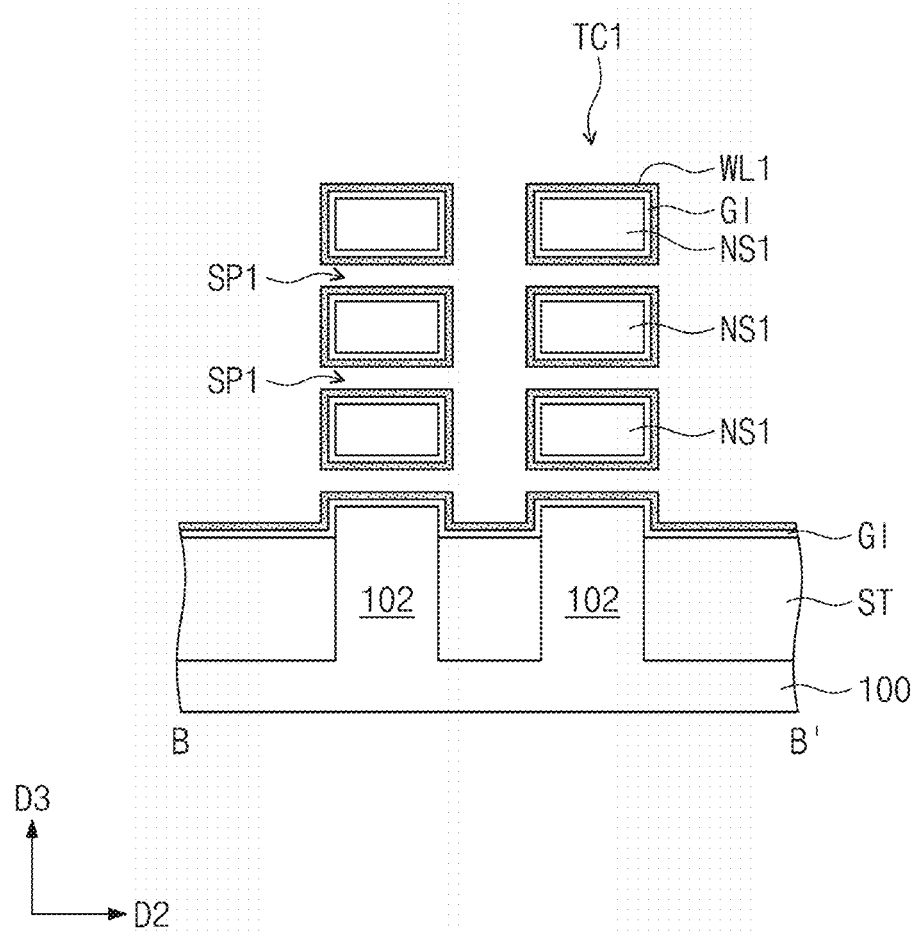

Referring to FIGS. 8A to 8C, the first work function adjusting layer WL1 may be conformally deposited in the first and second trenches TC1 and TC2. The first work function adjusting layer WL1 may be formed by a deposition process (e.g., an ALD, CVD, or PVD process). The first work function adjusting layer WL1 may conformally cover the gate dielectric layers GI. The first work function adjusting layer WL1 may be formed to enclose the first and second semiconductor patterns NS1 and NS2. The first work function adjusting layer WL1 may include a material having a relatively low work function. For example, the first work function adjusting layer WL1 may include titanium aluminum carbide (TiAlC), titanium aluminum nitride (TiAlN), or tantalum aluminum nitride (TaAlN).

Figure 9A:
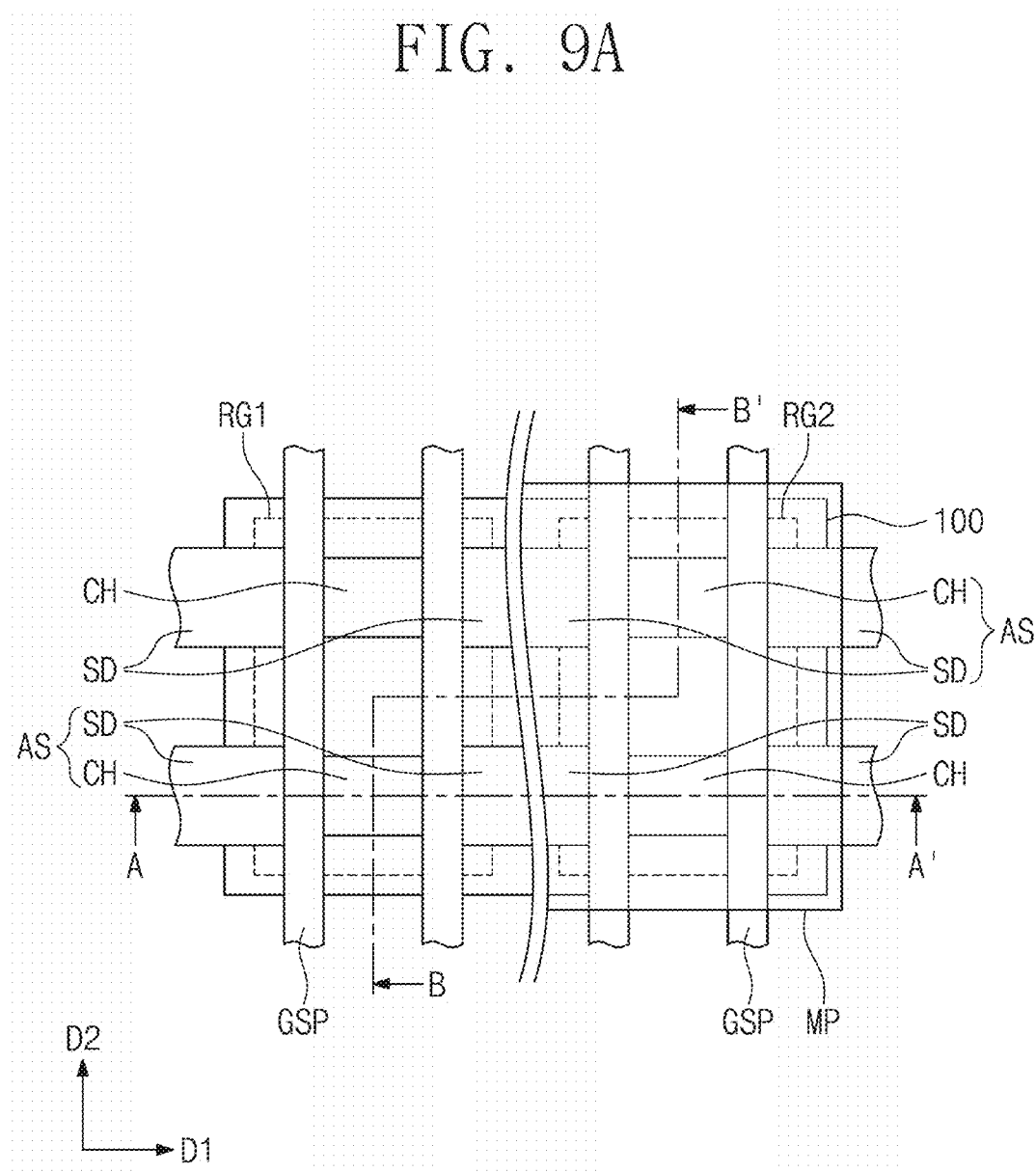
Figure 9B:
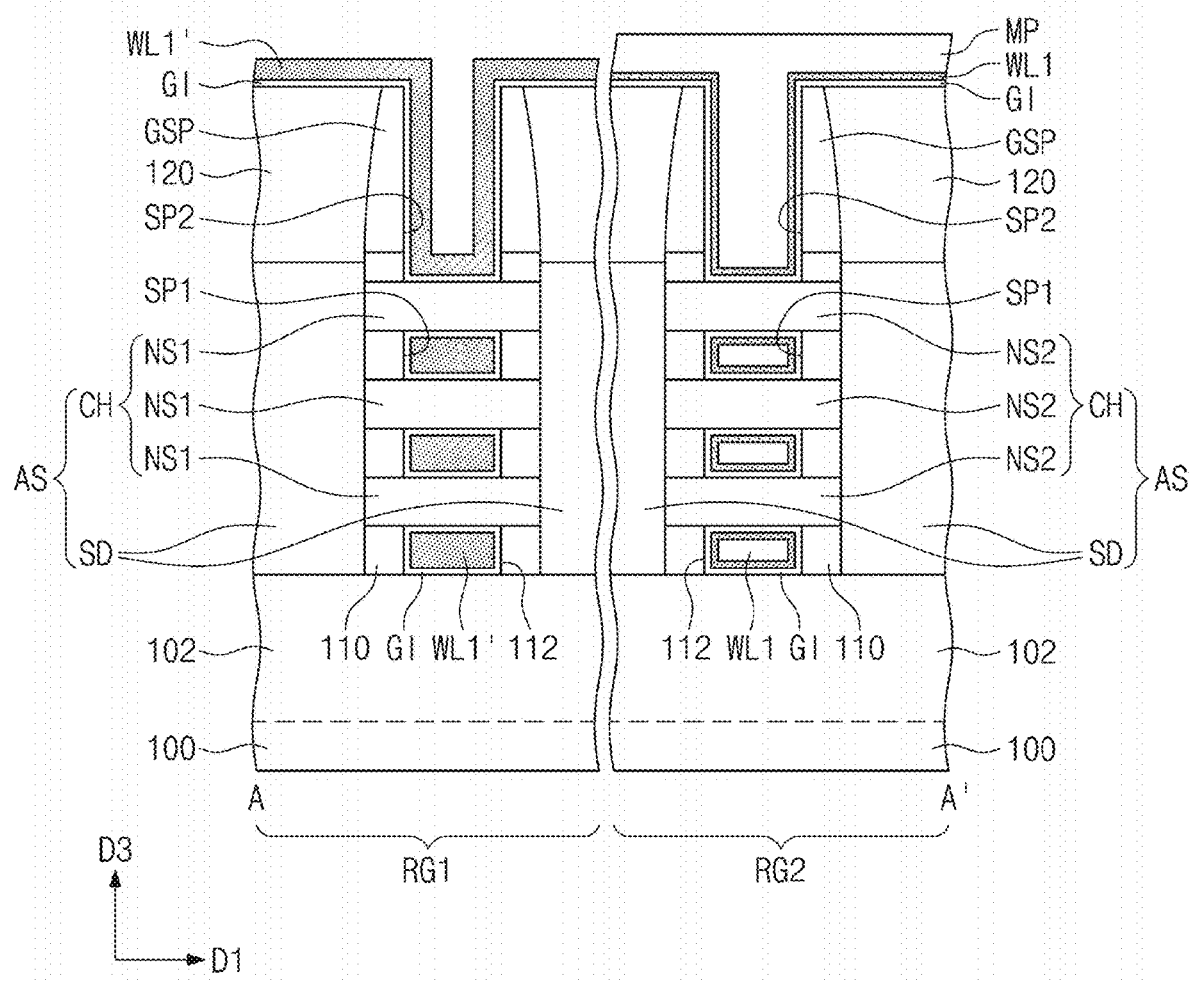
Figure 9C:
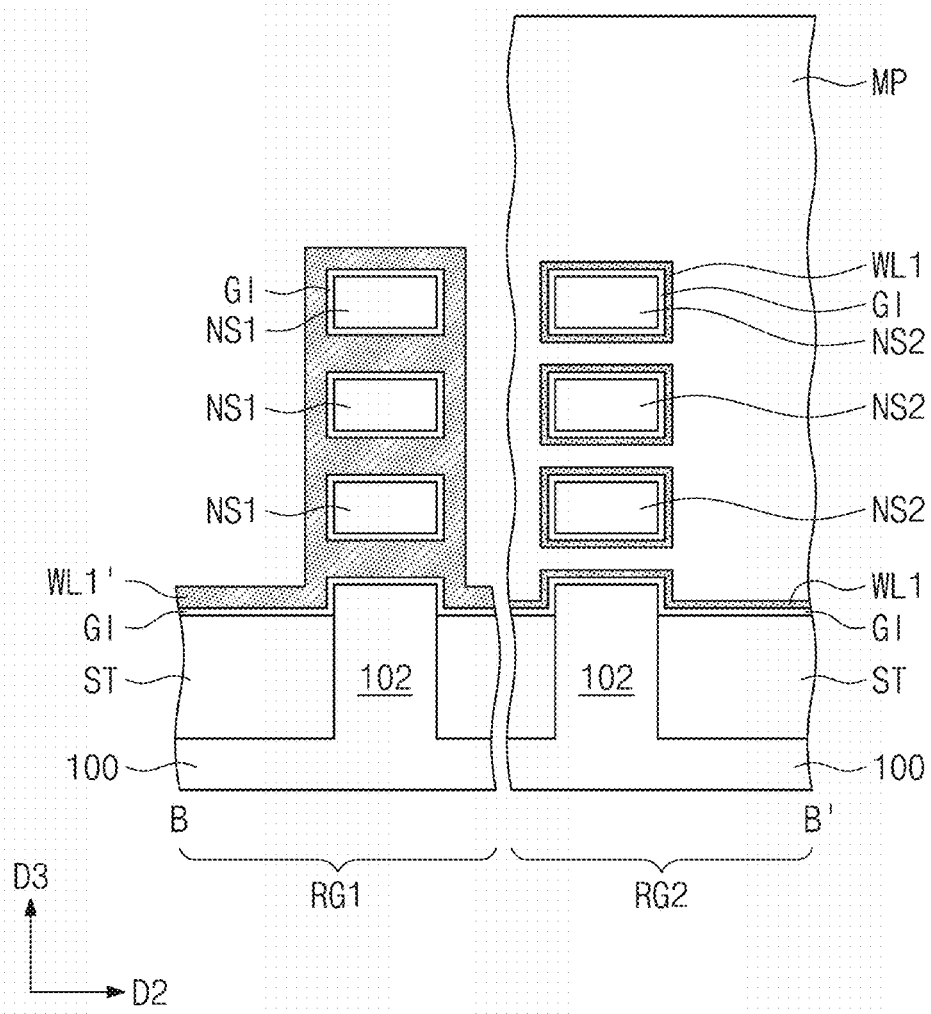

In certain embodiments, after the formation of the first work function adjusting layer WL1, the first work function adjusting layer WL1 may be additionally deposited on the first region RG1. As shown in FIGS. 9A to 9C, a mask pattern MP may be formed on the second region RG2. The mask pattern MP may be formed to expose the first region RG1. The deposition process may be additionally performed on the first work function adjusting layer WL1, which is exposed on the first region RG1. Accordingly, the first work function adjusting layer WL1' on the first region RG1 may be formed to be thicker than the first work function adjusting layer WL1 on the second region RG2. In certain embodiments, the work function adjusting layer WL1' may be formed to have a thick thickness on the first and second regions RG1 and RG2, a mask pattern MP may be formed on the first region RG1, and an upper portion of the first work function adjusting layer WL1 on the second region RG2 may be removed. In this case, a semiconductor device described with reference to FIGS. 2A to 2C may be fabricated.

In certain embodiments, the first work function adjusting layers WL1 in the first and second regions RG1 and RG2 may be formed to include different materials from each other. For example, after the formation of the first work function adjusting layer WL1, the mask pattern MP may be formed on the second region RG2. The first work function adjusting layer WL1 exposed on the first region RG1 may be removed. Thereafter, a deposition process may be performed to form a layer, which is formed of a material different from the first work function adjusting layer WL1 on the second region RG2, on the first region RG1. In this case, the first and second transistors TR1 and TR2, which are formed on the first and second regions RG1 and RG2, respectively, may be of different types.

The description that follows will refer to the embodiments shown in FIGS. 8A to 8C.

Figure 10B:
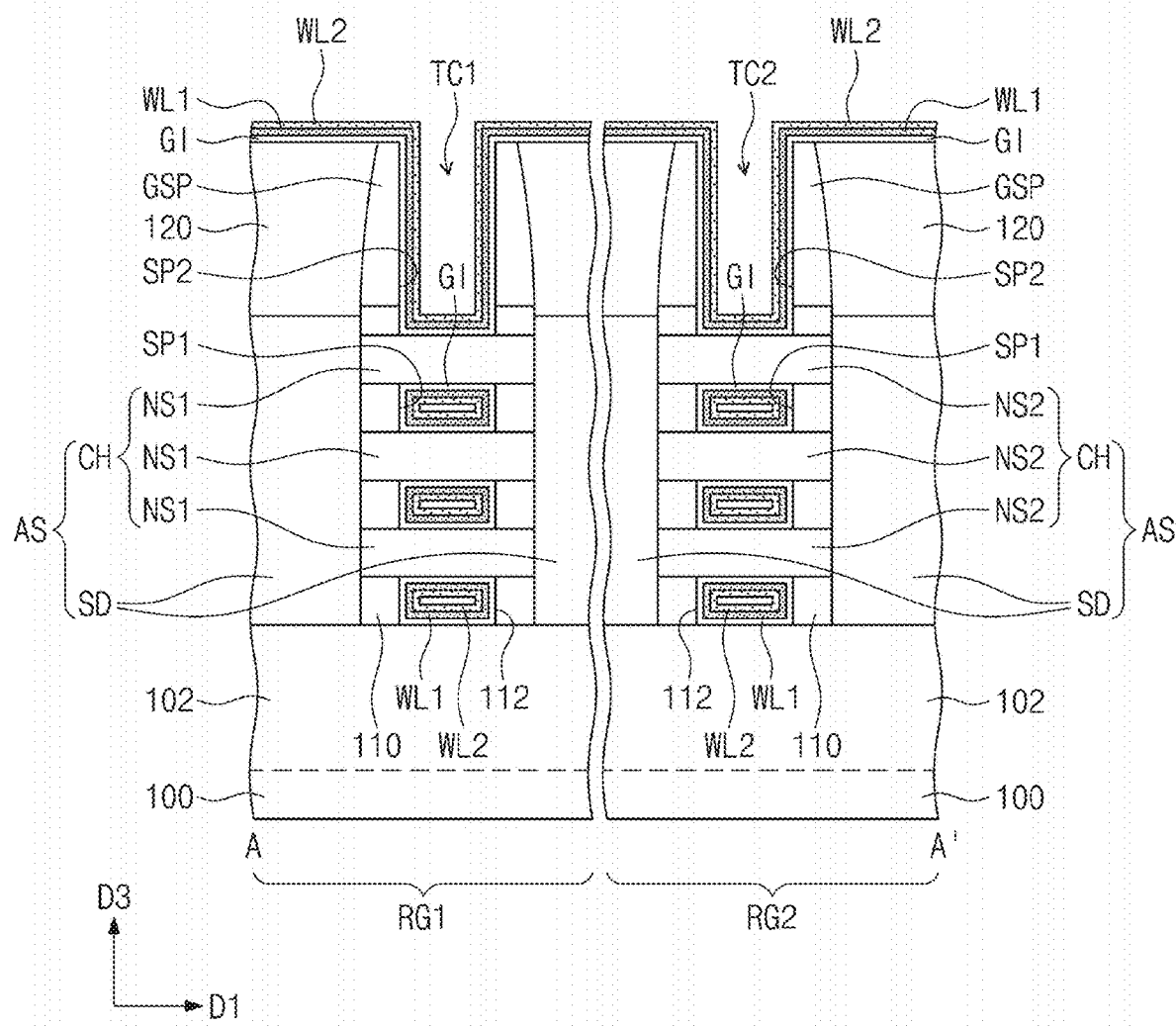
Figure 10C:
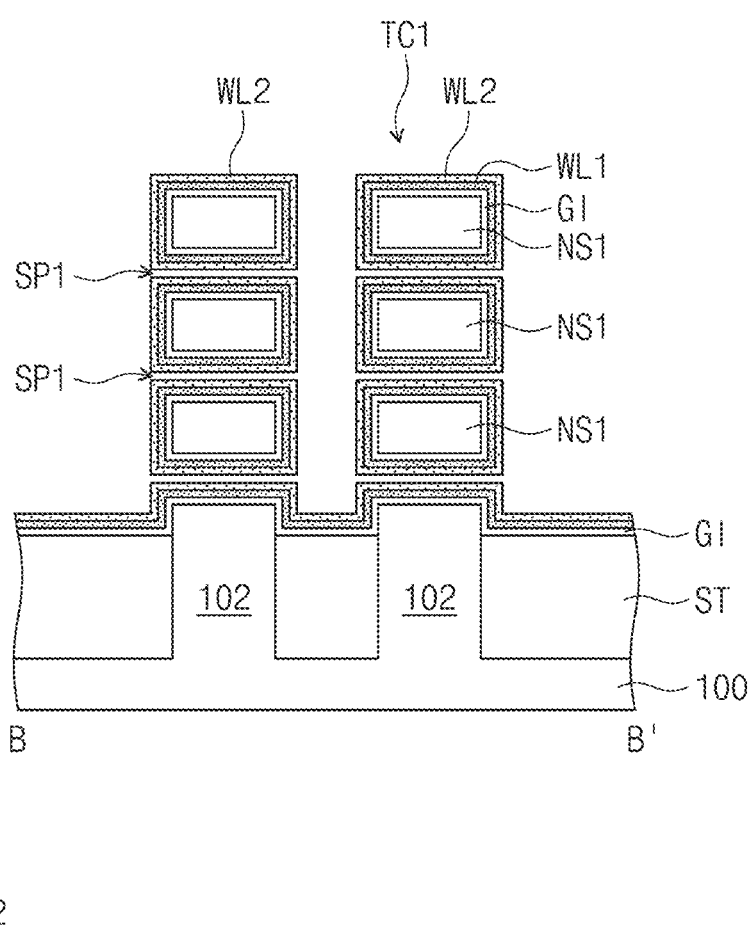

Referring to FIGS. 10A to 10C, a second work function adjusting layer WL2 may be formed in the first and second trenches TC1 and TC2. The second work function adjusting layer WL2 may be conformally deposited in the first and second trenches TC1 and TC2. The second work function adjusting layer WL2 may be formed through a deposition process (e.g., ALD, CVD, or PVD). The second work function adjusting layer WL2 may conformally cover the first work function adjusting layer WL1. The second work function adjusting layer WL2 may include a material having a relatively high work function. For example, the second work function adjusting layer WL2 may include titanium nitride (TiN), titanium oxynitride (TiON), or tantalum nitride (TaN).

A first process S1 of forming the first work function adjusting layer WL1 and a second process S2 of forming the second work function adjusting layer WL2 may be performed in an in-situ manner. In other words, the first and second processes S1 and S2 may be continuously performed in the same process chamber. Here, the expression "continuously performed" may mean that a plurality of processes are performed in the same process condition, such as process time, process temperature, and ambient gas in the process chamber. In addition, the first and second processes S1 and S2 may be performed in a vacuum ambient (e.g., vacuum environment) or in an oxygen-free ambient (e.g., oxygen-free environment).

Figure 11B:
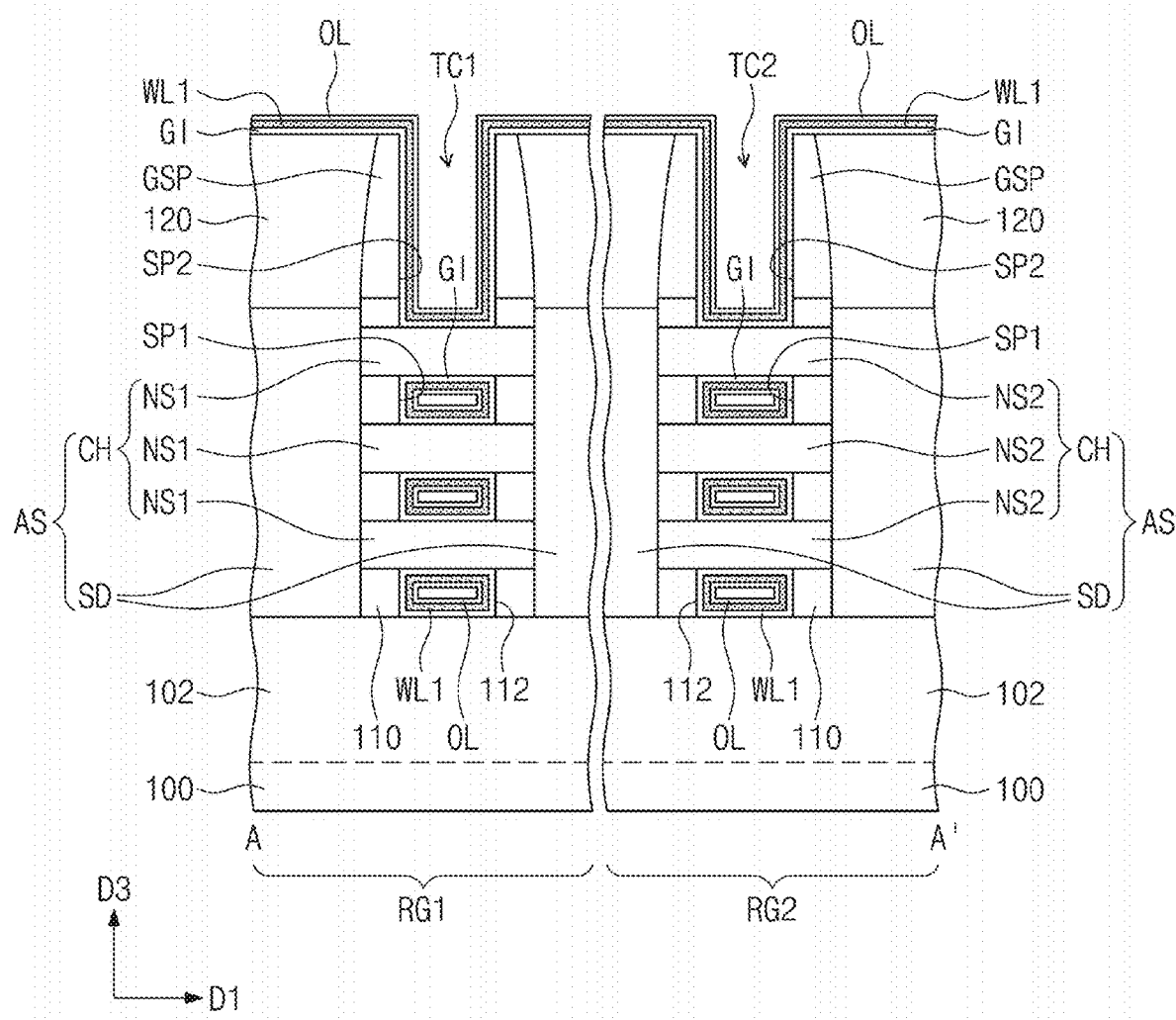
Figure 11C:
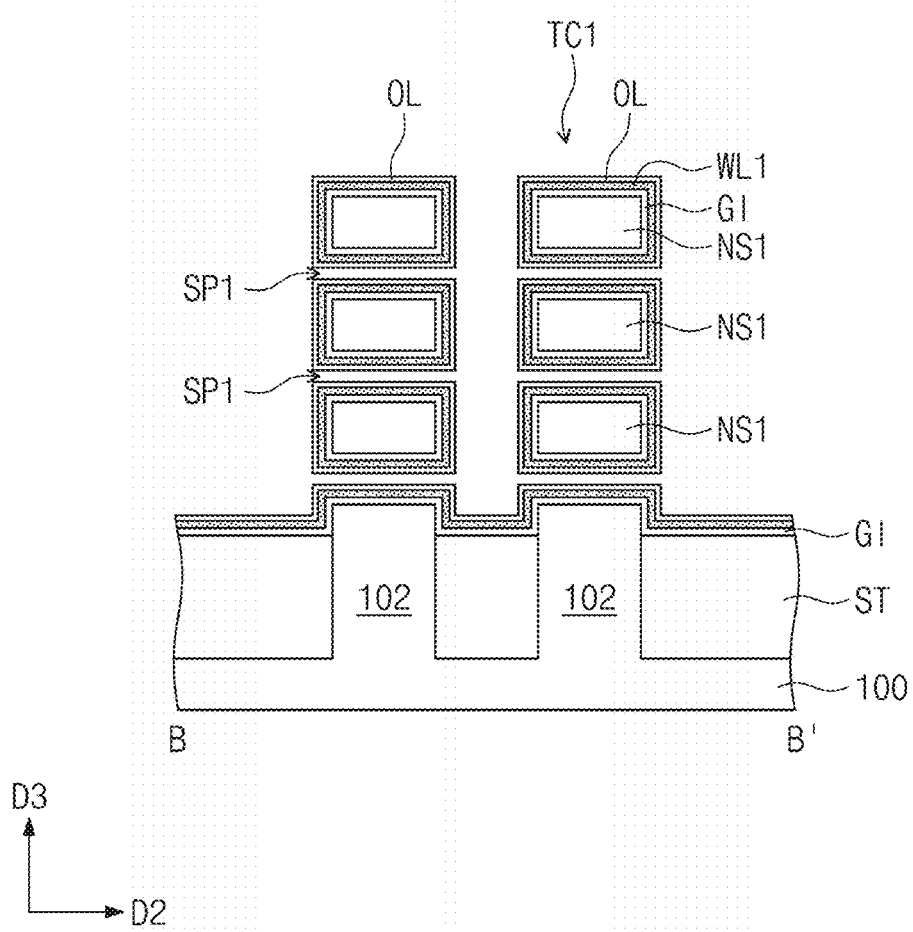

In general, to increase efficiency in a mass production system, the first process S1 of forming the first work function adjusting layer WL1 and the second process S2 of forming the second work function adjusting layer WL2 may be separately performed in different chambers. For example, the first process S1 of forming the first work function adjusting layer WL1 may be performed in a first chamber, and the second process S2 of forming the second work function adjusting layer WL2 may be performed in a second chamber. In this case, the first work function adjusting layer WL1 may be exposed to oxygen, while a semiconductor device in fabrication is transferred from the first chamber to the second chamber. In this case, as shown in FIGS. 11A to 11C, an exposed surface of the first work function adjusting layer WL1 may be oxidized to form an oxide layer OL on the first work function adjusting layer WL1. In the case where the first work function adjusting layer WL1 includes a material (e.g., aluminum (Al)) having high reactivity to oxygen, the formation of the oxide layer OL may be expedited. Accordingly, a portion of the first work function adjusting layer WL1 may form the oxide layer OL. In this case, a thickness of the first work function adjusting layer WL1 may be reduced or a material constituting the first work function adjusting layer WL1 may be diffused into the oxide layer OL to cause an increase in work function of the first work function adjusting layer WL1. This may lead to a difficulty in controlling threshold voltages of the transistors TR1 and TR2.

Furthermore, in the case where an additional layer, such as the oxide layer OL, is formed on the first work function adjusting layer WL1, the first and second work function adjusting layers WL1 and WL2, which are sequentially formed, may not be in contact with each other. In other words, the oxide layer OL may be interposed between the first and second work function adjusting layers WL1 and WL2. In this case, the electric resistance between the first and second work function adjusting layers WL1 and WL2 may be increased and electric characteristics of the semiconductor device may be deteriorated.

In an embodiment, the first and second processes S1 and S2 may be performed in an in-situ manner, and a chamber for such the in-situ manner may be in a vacuum ambient (e.g., vacuum environment) or in an oxygen-free ambient (e.g., oxygen-free environment). Thus, the first work function adjusting layer WL1 may be limited and/or prevented from being exposed to an external oxygen, and thus, an additional layer, such as an oxide layer, may not be formed on the first work function adjusting layer WL1. Here, an amount of oxygen (O) included in the first work function adjusting layer WL1 may be substantially zero or may range from 0% to 30%. A content of aluminum (Al) in the first work function adjusting layer WL1 before the formation of the second work function adjusting layer WL2 may be substantially equal to a content of aluminum (Al) in the first work function adjusting layer WL1 after the formation of the second work function adjusting layer WL2. It may be possible to easily adjust the threshold voltages of the transistors TR1 and TR2, without loss of the first work function adjusting layer WL1, and since the first and second work function adjusting layers WL1 and WL2 are in direct contact with each other, it may be possible to limit and/or prevent electric characteristics of the semiconductor device from being deteriorated.

In certain embodiments, the first process S1 of forming the first work function adjusting layer WL1 may be performed in a first chamber, and the second process S2 of forming the second work function adjusting layer WL2 may be performed in a second chamber. First of all, the oxide layer OL may be formed on the first work function adjusting layer WL1. Thereafter, a semiconductor device in production may be transferred to the second chamber, and a process of removing the oxide layer OL may be performed in the second chamber, before the formation of the second work function adjusting layer WL2. Thus, the second work function adjusting layer WL2 may be formed on the first work function adjusting layer WL1 to be in direct contact with the first work function adjusting layer WL1.

Referring back to FIGS. 1A to 1C, each of the gate dielectric layers GI, the first work function adjusting layer WL1, and the second work function adjusting layer WL2 may be partially removed. In detail, portions of the gate dielectric layers GI, a portion of the first work function adjusting layer WL1, and a portion of the second work function adjusting layer WL2, which are positioned on the interlayered insulating layer 120, may be removed, and at this time, upper portions of the gate dielectric layers GI, an upper portion of the first work function adjusting layer WL1, and an upper portion of the second work function adjusting layer WL2, which are disposed in the first and second trenches TC1 and TC2, may be recessed. As a result of the recess process, the first and second work function adjusting layers WL1 and WL2 may form the first and second work function adjusting patterns WF1 and WF2, respectively.

The gate electrodes GE may be formed in the first and second trenches TC1 and TC2. The gate electrodes GE may be formed on the second work function adjusting patterns WF2. The gate electrodes GE may fill remaining portions of the first and second trenches TC1 and TC2. The gate electrodes GE may be formed using a low resistance metal. For example, a conductive material may be formed to fill the first and second trenches TC1 and TC2 and to cover the interlayered insulating layer 120, and then, a planarization process may be performed to expose a top surface of the interlayered insulating layer 120.

Upper portions of the gate electrodes GE may be recessed to form groove regions between the gate spacers GSP. A gate capping pattern CP may be formed in the groove region. The formation of the gate capping pattern CP may include forming a gate capping pattern on the interlayered insulating layer 120 to fill the groove region and planarizing the gate capping pattern to expose the interlayered insulating layer 120. The gate capping pattern may be formed using silicon oxide (SiO), silicon nitride (SiN), or silicon oxynitride (SiON).

The gate dielectric layers GI, the first and second work function adjusting patterns WF1 and WF2, the gate electrodes GE, the gate capping patterns CP, and the gate spacers GSP may constitute the gate structures GS1 and GS2. The first semiconductor patterns NS1 and the second semiconductor patterns NS2 may constitute the channel pattern CH. The source/drain patterns SD may be spaced apart from each other with the channel pattern CH interposed therebetween in the first direction D1, and each of the source/drain patterns SD may be in contact with the channel pattern CH. The channel pattern CH and the source/drain patterns SD may constitute an active structure AS provided on the base active pattern 102. The active structure AS and the gate structures GS1 and GS2 may constitute a gate-all-around type field effect transistor.

Although not shown, an upper insulating layer (not shown) may be formed on the interlayered insulating layer 120. Contacts (not shown) may be formed to penetrate the upper insulating layer and the interlayered insulating layer 120 and may be electrically connected to the source/drain patterns SD or the gate structures GS1 and GS2. Interconnection lines (not shown) may be formed on the upper insulating layer and may be coupled to the contacts. The contacts and the interconnection lines may be formed of a conductive material.

A semiconductor device may be fabricated by the afore-described method.

In a method of fabricating a semiconductor device according to an embodiment of inventive concepts, a first work function adjusting layer may be limited and/or prevented from being exposed to an external oxygen, and thus, an additional layer, such as an oxide layer, may not be formed on the first work function adjusting layer. Accordingly, it may be possible to easily adjust threshold voltages of transistors, without loss of the first work function adjusting layer. In addition, since the first and second work function adjusting layers are formed to be in direct contact with each other, it may be possible to limit and/or prevent electric characteristics of the semiconductor device from being deteriorated.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate;
   a first active structure and a second active structure on the substrate and spaced apart from each other, each of the first active structure and the second active structure including semiconductor patterns stacked on the substrate;
   a first gate electrode crossing the first active structure, the first gate electrode including a first dielectric layer enclosing the semiconductor patterns of the first active structure, a first work function adjusting pattern enclosing the first dielectric layer, and a second work function adjusting pattern enclosing a discrete portion of the first work function adjusting pattern,
      the first gate electrode not including an additional work function adjusting pattern between the first dielectric layer and the first work function adjusting pattern,
      the first work function adjusting pattern being formed of an aluminum-containing material,
   the second work function adjusting pattern enclosing the discrete portion of the first work function adjusting pattern by wrapping around an upper surface, a side surface, and a lower surface of the discrete portion of the first work function adjusting pattern; and
   a second gate electrode crossing the second active structure, the second gate electrode including a second dielectric layer enclosing the semiconductor patterns of the second active structure and a third work function adjusting pattern enclosing the second dielectric layer,
   a content of oxygen (O) in the first work function adjusting pattern ranges from 0% to 30%, and
   the first work function adjusting pattern is in direct contact with the second work function adjusting pattern, wherein
   a work function of the first work function adjusting pattern is lower than a work function of the second work function adjusting pattern,
   the semiconductor patterns of the first active structure are stacked on top of each other and spaced apart in a vertical direction over the substrate,
   the first gate electrode includes a conductive layer including a conductive material different from a material of the first work function adjusting pattern and a material of the second work function adjusting pattern, and
   a portion of the conductive layer fills a space between two adjacent semiconductor patterns stacked on top of each other in the vertical direction among the semiconductor patterns of the first active structure, and
   wherein the first work function adjusting pattern directly contacts the first dielectric layer.

2. The semiconductor device of claim 1, wherein the first work function adjusting pattern includes titanium aluminum carbide (TiAlC), and the second work function adjusting pattern includes titanium nitride (TiN).

3. The semiconductor device of claim 1, wherein the third work function adjusting pattern includes titanium oxynitride (TiON) or includes a multi-layered structure including titanium oxynitride (TiON) and titanium nitride (TiN).

4. The semiconductor device of claim 3, wherein a content of oxygen (O) in the third work function adjusting pattern ranges from 30% to 60%.

5. The semiconductor device of claim 1, wherein a space between the semiconductor patterns of the first active structure ranges from 1 nm to 10 nm, and a space between the semiconductor patterns of the second active structure ranges from 1 nm to 10 nm.

6. The semiconductor device of claim 1, wherein
   the first active structure and the first gate electrode constitute a first transistor of n-type, and
   the second active structure and the second gate electrode constitute a second transistor of p-type.

7. The semiconductor device of claim 1, further comprising:
   source/drain patterns on the substrate, the source/drain patterns spaced apart from each other with the first gate electrode or the second gate electrode therebetween,
   wherein each of the semiconductor patterns of the first active structure and the second active structure connects the source/drain patterns to each other.

8. The semiconductor device of claim 1, wherein
   the first work function adjusting pattern and the second work function adjusting pattern enclose a same one of the semiconductor patterns in the first active structure, and
   the first work function adjusting pattern and the second work function adjusting pattern both extend between two adjacent semiconductor patterns stacked on top of each other in the vertical direction among the semiconductor patterns of the first active structure.

9. A semiconductor device, comprising:
   a substrate;
   a channel pattern stacked on the substrate, the channel pattern including semiconductor patterns; and
   a gate electrode on the substrate, the gate electrode extending to cross the channel pattern,
   the gate electrode including dielectric layers, first work function adjusting patterns, and second work function adjusting patterns,
   the dielectric layers enclosing the semiconductor patterns, respectively,
   the first work function adjusting patterns enclosing the dielectric layers, respectively, such that an additional work function adjusting pattern is not disposed between the first work function adjusting patterns and the dielectric layers enclosed by the first work function adjusting patterns, and
   the second work function adjusting patterns enclosing the first work function adjusting patterns, respectively,
   the first work function adjusting patterns being formed of an aluminum- containing material, and
   each corresponding one of the first work function adjusting patterns directly contacting a corresponding one of the second work function adjusting patterns enclosing the corresponding one of the first work function adjusting patterns, such that a discrete portion of the corresponding one of the second work function adjusting patterns wraps around an upper surface, a side surface, and a lower surface of a respective discrete portion of the corresponding one of the first work function adjusting patterns, wherein the semiconductor device does not include an oxide layer or a nitride layer between the first work function adjusting patterns and the second work function adjusting patterns that are adjacent to each other, wherein the semiconductor patterns of the channel pattern are stacked on top of each other and spaced apart in a vertical direction over the substrate, wherein the gate electrode includes a conductive layer including a conductive material different from a material of the first work function adjusting patterns and a material of the second work function adjusting patterns, wherein a portion of the conductive layer fills a space between two adjacent semiconductor patterns stacked on top of each other in the vertical direction among the semiconductor patterns of the channel pattern, wherein the first work function adjusting patterns include titanium aluminum carbide (TiAlC), and the second work function adjusting patterns include titanium nitride (TiN), and wherein the first work function adjusting patterns directly contact the dielectric layers.

10. The semiconductor device of claim 9, wherein the first work function adjusting patterns have a work function that is lower than a work function of the second work function adjusting patterns.

11. The semiconductor device of claim 3, wherein a content of oxygen (O) in the first work function adjusting patterns ranges from 0% to 30%.

12. The semiconductor device of claim 9, wherein a space between the semiconductor patterns ranges from 1 nm to 15 nm.

13. The semiconductor device of claim 9, further comprising:

source/drain patterns on the substrate, the source/drain patterns being spaced apart from each other with the gate electrode therebetween, wherein the channel pattern connects the source/drain patterns to each other.

14. The semiconductor device of claim 13, further comprising:

spacer patterns on the substrate, the spacer patterns being below each of the semiconductor patterns and spaced apart from each other with the gate electrode therebetween, wherein each of the spacer patterns is interposed between each of the source/drain patterns and the gate electrode.

15. The semiconductor device of claim 9, wherein the corresponding one of the first work function adjusting patterns and the corresponding one of the second work function adjusting patterns enclose a same one of the dielectric layers and a same one of the semiconductor patterns, and the corresponding one of the first work function adjusting patterns and the corresponding one of the second work function adjusting patterns both extend between two adjacent semiconductor patterns stacked on top of each other in the vertical direction among the semiconductor patterns of the channel pattern.

* * * * *